(12) United States Patent
Bernhardt

(10) Patent No.: US 11,975,358 B1
(45) Date of Patent: May 7, 2024

(54) ULTRASONIC RF GENERATOR WITH AUTOMATICALLY CONTROLLABLE OUTPUT TUNING

(71) Applicant: Cleaning Technologies Group, LLC, Jamestown, NY (US)

(72) Inventor: Brian D. Bernhardt, Jamestown, NY (US)

(73) Assignee: Cleaning Technologies Group, LLC, Jamestown, NY (US)

( * ) Notice: Subject to any disclaimer, the term of this patent is extended or adjusted under 35 U.S.C. 154(b) by 0 days.

(21) Appl. No.: 17/357,015

(22) Filed: Jun. 24, 2021

(51) Int. Cl.
*B08B 3/12* (2006.01)
*B06B 1/02* (2006.01)
*B08B 13/00* (2006.01)
*H01L 21/67* (2006.01)

(52) U.S. Cl.
CPC ............... *B06B 1/0253* (2013.01); *B08B 3/12* (2013.01); *B08B 13/00* (2013.01); *H01L 21/67057* (2013.01); *B06B 2201/71* (2013.01)

(58) Field of Classification Search
CPC ... B06B 1/0223; B06B 1/0238; B06B 1/0246; B06B 1/0253; B06B 1/0261; B06B 2201/71; B08B 3/12; B08B 2209/005
See application file for complete search history.

(56) References Cited

U.S. PATENT DOCUMENTS

| | | |
|---|---|---|
| 3,066,232 A | 11/1962 | Branson |
| 3,094,314 A | 6/1963 | Kearney et al. |
| RE25,433 E | 8/1963 | Rich |
| 3,113,761 A | 12/1963 | Platzman |
| 3,152,295 A | 10/1964 | Schebler |
| 3,187,207 A | 6/1965 | Tomes |
| 3,230,403 A | 1/1966 | Lewis et al. |

(Continued)

FOREIGN PATENT DOCUMENTS

| | | | |
|---|---|---|---|
| DE | 2950893 | 12/1979 | |
| DE | 4208669 A1 * | 9/1993 | ........... B06B 1/0261 |

OTHER PUBLICATIONS

Machine Translation of Rehm et al., DE-4208669-A1, Sep. 1993. (Year: 1993).*

*Primary Examiner* — Michael E Barr
(74) *Attorney, Agent, or Firm* — Phillips Lytle LLP

(57) ABSTRACT

A system for delivering ultrasonic energy to a transducer load has at least one ultrasonic transducer, and a radio frequency (RF) generator for delivering RF power to the transducer load. The RF generator has an output circuit that has at least one tunable resonant frequency, a voltage circuitry system that senses an output voltage waveform, a current circuitry system that senses an output current waveform, and a phase detector circuit for measuring a phase differential between the output voltage waveform and the output current waveform. The phase detector circuit has an XOR gate that receive a voltage signal input and a current signal input, a comparator that compares the measured phase differential to a desired phase difference to generate a phase value; and a motor controller evaluates the phase value and based on the phase value automatically repositions or maintains the position of a moveable metallic core within a variable inductor, to generate a desired ultrasonic transmission in a liquid wherein the voltage and current phases are approximately aligned.

12 Claims, 11 Drawing Sheets

(56) References Cited

U.S. PATENT DOCUMENTS

| | | |
|---|---|---|
| 3,293,456 A | 12/1966 | Shoh |
| 3,318,578 A | 5/1967 | Branson |
| 3,629,726 A | 12/1971 | Popescu |
| 3,638,087 A | 1/1972 | Ratcliff |
| 3,648,188 A | 3/1972 | Ratcliff |
| 3,651,352 A | 3/1972 | Puskas |
| 3,690,333 A | 9/1972 | Kierner |
| 3,727,112 A | 4/1973 | Popescu |
| 3,778,758 A | 12/1973 | Carson |
| 3,804,329 A | 4/1974 | Martner |
| 3,842,340 A | 10/1974 | Brandquist |
| 3,893,869 A | 7/1975 | Mayer et al. |
| 4,044,297 A | 8/1977 | Nobue et al. |
| 4,054,848 A | 10/1977 | Akita |
| 4,069,444 A | 1/1978 | Heim |
| 4,081,706 A | 3/1978 | Edelson |
| 4,109,174 A | 8/1978 | Hodgson |
| 4,118,649 A | 10/1978 | Shwartzman et al. |
| 4,141,608 A | 2/1979 | Breining et al. |
| 4,156,157 A | 5/1979 | Mabille |
| 4,175,242 A | 11/1979 | Kleinschmidt |
| 4,275,363 A | 6/1981 | Mishiro et al. |
| 4,409,999 A | 10/1983 | Pedziwiatr |
| 4,418,297 A | 11/1983 | Marshall |
| 4,527,901 A | 7/1985 | Cook |
| 4,543,130 A | 9/1985 | Shwartzman |
| 4,736,130 A | 4/1988 | Puskas |
| 4,836,684 A | 6/1989 | Javorik et al. |
| 5,143,103 A | 9/1992 | Basso et al. |
| 5,201,958 A | 4/1993 | Breunsbach et al. |
| 6,946,773 B2 | 9/2005 | Puskas |

\* cited by examiner

ULTRASONIC RF GENERATOR WITH AUTOMATICALLY CONTROLLABLE OUTPUT TUNING

FIELD OF THE INVENTION

The invention relates to systems and methods for cleaning and/or processing parts, e.g., semiconductor wafers, medical devices, machined parts, and industrial parts. In particular, the invention relates to ultrasonic systems, ultrasonic generators, ultrasonic transducers, and methods which support or enhance the application of ultrasonic energy within a liquid.

BACKGROUND OF THE INVENTION

As expressed in U.S. Pat. No. 6,946,773; "Ultrasonic energy has many uses; and applications of ultrasound are widespread in medicine, in the military industrial complex, and in engineering. One use of ultrasound in modern manufacturing and processing is to process and/or clean objects within liquids. For example, it is well-known that objects within an aqueous solution such as water can be cleaned by applying ultrasonic energy to the water. Typical ultrasound transducers are, for example, made from materials such as piezoelectrics, ceramics, or magnetostrictive (aluminum and iron alloys or nickel and iron alloys) which oscillate with the frequency of the applied voltage or current. These transducers transmit ultrasound into a tank filled with liquid that also covers some or all of the object to be cleaned or processed. By driving the transducer at its operational resonant frequency, e.g., 18 kHz, 25 kHz, 40 kHz, 670 kHz or 1 MHz, the transducer imparts ultrasonic energy to the liquid and, hence, to the object. The interaction between the energized liquid and the object create the desired cleaning or processing action.

By way of example, in the 1970s ultrasonic energy was used in liquid processing tanks and liquid cleaning tanks to enhance the manufacture of semiconductor devices and other delicate items. The typical ultrasonic frequency of such processes was a single frequency between 25 kHz to 50 kHz. Many prior generators exist which produce single frequency ultrasonics, including those described in U.S. Pat. Nos. 3,152,295; 3,293,456; 3,629,726; 3,638,087; 3,648, 188; 3,651,352; 3,727,112; 3,842,340; 4,044,297; 4,054, 848; 4,069,444; 4,081,706; 4,109,174; 4,141,608; 4,156, 157; 4,175,242; 4,275,363; and 4,418,297.

The early ultrasonic transducers were typically piezoelectric ceramics that were "clamped," i.e., compressed, so as to operate at their fundamental resonant or anti-resonant frequency. Many prior clamped transducers exist, including those found in U.S. Pat. Nos. 3,066,232; 3,094,314; 3,113, 761; 3,187,207; 3,230,403; 3,778,758; 3,804,329 and RE 25,433. Other ultrasound transducers are made of alloys that possess magnetostriction properties which cause them to expand or contract under the influence of a magnetic field.

As mentioned above, these transducers were bonded to or placed in tanks which housed the cleaning or processing liquid. Typically, such tanks were constructed of a material compatible with the processing liquid, such as: 316L stainless steel for most aqueous chemistries; 304 stainless steel for many solvents; plastics such as Teflon, polypropylene, and metals such as tantalum for strong acids; and coated metals such as Teflon-coated stainless steel for corrosive liquids.

In order to deliver ultrasound to the solution within the tank, the transducers were attached to, or made integral with, the tank. In one method, for example, epoxy bonds or brazing were used to attach the transducers to tanks made of metallic stainless steel, tantalum, titanium, or Hastalloy. In another prior method, the drive elements of the transducers were machined or cast into the tank material, and the piezoelectric ceramic and backplates were assembled to the drive elements.

Some of the cited references also provide systems which utilize ultrasonic transducers in conjunction with plastic tanks. Typically, the tank's plastic surface was etched to create a surface that facilitated an epoxy bond thereon. The transducers were bonded with epoxy to the etched surface, and various techniques were used to keep the system cool to protect the plastic from deterioration. One such technique was to bond the transducers to an aluminum plate that would act as a heat-sink, and then to bond the aluminum plate to the plastic surface. Often, fans would be directed toward the aluminum plate and the transducers so as to enhance cooling. Another cooling technique utilized a thin plastic, or a process of machining the plastic at the transducer bonding position, to provide a thin wall at the transducer mounting position. This technique enhanced the cooling of the plastic and transducer by improved heat conduction into the liquid, and further improved the coupling of sound into the processing liquid because of less sound absorption.

With advances in plastic formulations such as PEEK (polyetheretherketone), the cited references suggested improvements to the plastic ultrasonic tank by further reducing the sound absorption within the plastic material. The cited references further developed techniques for molding the transducers into the plastic material, such as through injection and rotational molding, which further improved the manufacturing of the tank as well as the processing characteristics within the tank.

For other materials such as ceramics, glass, Pyrex and quartz, the cited references disclosed using epoxy to bond the transducer to the tank surface. Casting the transducer into the material was also possible but was not commercially used. Often, the radiating surface (i.e., the surface(s) with the ultrasonic transducers mounted thereon or therein), usually the tank bottom, would be pitched by at least one-quarter wavelength to upset standing wave patterns within the tank. Other tank configurations which provided similar advantages are reported in the cited references, such as disclosed by Javorik in U.S. Pat. No. 4,836,684.

An alternative to bonding the transducer directly to the bottom or sides of the tank was developed and disclosed in cited references by bonding the transducer to a window or plate that was sealed within a tank opening via a gasket. This had several advantages. If the transducer failed, or if cavitation erosion occurred within the radiating surface, the window or plate could be replaced without the expense of replacing the whole tank. Another advantage was the ability to use dissimilar materials. For example, a quartz tank with a tantalum window offered the advantage of an acid resistant material for the tank, and a metallic bonding and radiating surface for the transducer. In U.S. Pat. No. 4,118,649, Schwartzman described the use of a tantalum window with bonded transducers which coupled ultrasonic energy into a semiconductor wafer process tank.

A second alternative to direct bonding between the transducers and the tank was developed, in the cited references, by bonding the transducers inside a sealed container, called an "immersible" or "submersible," which was placed under the liquid in the process or cleaning tank. Certain advantages were also presented in this method, including (a) the relatively inexpensive replacement of the container, and (b) the use of dissimilar materials, described above. In U.S. Pat. No. 3,318,578, Branson discloses one such immersible where both the transducers and the generator are sealed in the container.

There are, however, certain disadvantages associated with above-described alternatives to direct bonding between the transducers and the tank. One such disadvantage is the occasional entrapment of contamination within the area of the window, or the window gasket, or under the immersible. When contamination-free processing is required, a direct bonded coved corner tank provides a better solution.

Although tanks, plates, windows and immersibles usually had clamped transducers bonded thereon, the cited references sometimes utilized an unclamped piezoelectric shape or an array of unclamped piezoelectric shapes, such as PZT-4 or PZT-8, which were bonded directly to the tank, plate, window or immersible. By way of example, U.S. Pat. No. 4,118,649 describes transducers shaped into hexagons, rectangles, circles, and squares and bonded to a window. These unclamped transducers had the advantage of lower cost. They further could be operated in either the radial mode, for low frequency resonance, or in the longitudinal mode for "megasonic" frequency resonance (i.e., "megasonic" frequencies generally correspond to those frequencies between about 600 kHz and 2 MHz).

Nevertheless, these unclamped transducers proved to be less reliable as compared to clamped transducers. Accordingly, these shaped transducer arrays were used primarily in low-cost bench-top ultrasonic baths, or in megasonic equipment where high frequency ultrasonic resonance was utilized. Still, these transducers proved to be particularly unreliable when operating at megasonic frequencies because of the high frequency stress affecting the ceramics.

One other system disclosed in the cited references used to couple acoustics into a liquid is commonly referred to as a "double boiler" system. In the double boiler system, an ultrasonic plate, tank, window or immersible transmits the ultrasonics into a coupling liquid. A processing tank, beaker or other container containing the processing or cleaning chemistry is then immersed into the coupling liquid. Accordingly, the ultrasound generated within the coupling liquid transmits into the tank containing the processing or cleaning liquid. The double boiler system has several advantages. One advantage is in material selection: the transducer support structure can be made out of an inexpensive material, such as stainless steel; the coupling liquid can be a relatively inert substance, such as [deionized] water, and the process tank can be a material such as quartz or plastic material, which fares well with an aggressive chemistry such as sulfuric acid. Another advantage is that one transducer driving a relatively inert coupling liquid can deliver ultrasound into several different processing tanks, each containing different chemistries. Other advantages of the double boiler system are that the coupling fluid can be chosen so that its threshold of cavitation is above the cavitation threshold of the processing chemistry; and the depth of the coupling liquid can be adjusted for maximum transmission efficiency into the process tank(s). U.S. Pat. No. 4,543,130 discloses one double boiler system where sound is transmitted into an inert liquid, through a quartz window, and into the semiconductor cleaning liquid.

The cited references also recognize multi-functional, single chamber ultrasonic process systems which deliver ultrasonic cleaning or processing to liquids. In such systems, the cleaning, rinsing, and drying are done in the same tank. Pedziwiatr discloses one such system in U.S. Pat. No. 4,409,999, where a single ultrasonic cleaning tank is alternately filled and drained with cleaning solution and rinsing solution and is thereafter supplied with drying air. Other examples of single-chamber ultrasonic process systems are disclosed in U.S. Pat. Nos. 3,690,333; 5,143,103; 5,201,958, and German Patent No. 29 50 893.

In the cited references, "directed field tanks" are sometimes employed where the parts to be processed have fairly significant absorption at ultrasonic frequencies. More particularly, a directed field tank has transducers mounted on several sides of the tank, where each side is angled such that ultrasound is directed toward the center of the tank from the several sides. This technique is useful, for example, in supplying ultrasound to the center of a filled wafer boat.

In the late 1980s, as semiconductor device geometries became smaller, and as densities became higher, many shortcomings were discovered with respect to conventional low-frequency ultrasonic processing and cleaning of semiconductor wafers. The main disadvantage was that the existing ultrasound systems damaged the parts, and reduced production yields. In particular, such systems typically generated a sound wave with a single frequency, or with a very narrow band of frequencies. In many cases, the single frequency, or narrow band of frequencies, would change as a function of the temperature and age of the transducers. In any event, the cited references' ultrasonic systems sometimes generated sufficient cycles of sound within a narrow bandwidth so as to excite or resonate a mode of the processed part. The relatively large displacement amplitudes that exist during such a mode resonance would often damage the delicate part.

Another disadvantage of single frequency ultrasound (or narrow band ultrasound) is the standing waves created by the resonances within the liquid. The pressure anti-nodes in this standing wave are regions of intense cavitation and the pressure nodes are regions of little activity. Therefore, undesirable and non-uniform processing occurs in a standing wave sound field.

In addition to the resonant and standing wave damages caused by single frequency ultrasound (or narrow band ultrasound), damages are also caused by (a) the energy levels of each cavitation implosion, and (b) by lower frequency resonances, each of which is discussed below.

The cited references' methods for eliminating or reducing the damage caused by the energy in each cavitation implosion are well known. The energy in each cavitation implosion decreases as the temperature of the liquid is increased, as the pressure on the liquid is decreased, as the surface tension of the liquid is decreased, and as the frequency of the sound is increased. Any one or combination of these methods are used to decrease the energy in each cavitation implosion.

By way of example, one benefit in reducing the energy in each cavitation implosion is realized in the manufacture of hard disk drives for computers. The base media for a hard disk is an aluminum lapped and polished disk. These disks are subjected to 40 kHz ultrasonic cleaning in aqueous solutions with moderate temperature, often resulting in pitting caused by cavitation that removes the base material from the surface of the aluminum disk. As discussed above, one solution to this problem is to raise the temperature of the aqueous solution to above 90° C. This causes the energy in each cavitation implosion to be less than the energy which typically removes base material from the aluminum disk. It is important, however, to keep the temperature below a value (typically 95° C.) which provides a cavitation implosion that is strong enough to remove the contamination. Another solution to the problem is to use a higher frequency ultrasound. A 72 kHz ultrasonic system typically has the proper energy level in each cavitation implosion, with moderate temperature aqueous solutions, to remove contamination without removing base material from the lapped and polished aluminum disk.

In the cited references, wet bench systems often consist of several low frequency ultrasonic and/or megasonic tanks with different chemistries disposed therein. For example, a cleaning tank followed by two rinsing tanks, usually in a reverse cascading configuration, is a common wet bench configuration. In wet bench systems, there is an optimum value for the energy in each cavitation implosion; the highest energy cavitation implosion that does not cause cavitation damage to the part being processed or cleaned. However, because different chemistries are used in different tanks in the wet bench system, the energy in each cavitation implosion, for a given frequency, will be different in each tank. Therefore, not all tanks will have the optimum value of energy in each cavitation implosion. This problem has been addressed in the cited references by using different frequency ultrasonics in the different tanks. For example, the cleaning tank can have a chemistry with low surface tension, where a low frequency such as 40 kHz gives the optimum energy in each cavitation implosion. The rinsing tanks, on the other hand, might use [deionized] water, which has a high surface tension; and thus 72 kHz ultrasonics may be needed to match the energy of the 40 kHz tank for each cavitation implosion.

In single chamber process systems, different chemistries are pumped in and out of one tank. Because such process systems typically generate single or narrow band frequencies, or frequencies in a finite bandwidth, the energy in each cavitation implosion is optimum for one chemistry and not generally optimum for the other chemistries. Such systems are therefore relatively inefficient for use with many different chemistries.

Certain prior ultrasonic systems generate ultrasonic frequencies in two or more unconnected frequencies, such as 40 kHz and 68 kHz. Although these systems had great commercial appeal, experimental results have showed little or no merit to these multi-frequency systems. Such systems tend to have all of the problems listed above, whereby the cleaning and damaging aspects of ultrasound are generally dependent upon a single frequency. That is, for example, if the higher frequency provides adequate cleaning, without damage, the lower frequency may cause cavitation damage to the part. By way of a further example, if the lower frequency provides cleaning without damage, then the higher frequency has little or no practical value.

Cavitation damage can also occur when the delicate parts are removed from an operating ultrasonic bath. This damage occurs when the ultrasound reflects off of the liquid-air interface at the top of the tank to create non-uniform hot spots, i.e., zones of intense cavitation. The cited references has addressed this problem by turning the ultrasonics off before passing a delicate part through the liquid-air interface.

Low frequency resonant damage is a relatively new phenomenon. The cited references has focused on solving the other, more significant problems—i.e., ultrasonic frequency resonance and cavitation damage—before addressing the low frequency resonant effects of an ultrasonic system. However, some of the cited references' solutions to low frequency ultrasonic damage are, in part, due to a reaction to the problems associated with 25 kHz to 50 kHz ultrasound, described above. Specifically, some of the cited references have primarily focused on utilizing high frequency ultrasound in the processing and cleaning of semiconductor wafers and other delicate parts. These high frequency ultrasonic systems are single-frequency, continuous wave (CW) systems which operate from 600 kHz to about 2 MHz, a frequency range which is referred to as "megasonics" in the cited references.

One such megasonic system is disclosed in U.S. Pat. No. 3,893,869. The transducers of this system and other similar systems are typically 0.1-inch-thick and are unclamped piezoelectric ceramics driven at their resonant frequency by a single frequency continuous-wave generator. All the techniques described above, e.g., material selections, tank configurations, and bonding techniques, and used with lower frequency ultrasonics were employed in the megasonic frequency systems of the cited references. For example, because of the aggressive chemistries used, quartz or Teflon tanks with a transducerized quartz window became a common configuration adapted from lower frequency ultrasonic systems.

As described earlier and disclosed in U.S. Pat. No. 4,118,649, the bonding of piezoelectric shapes to a tank, plate, window or immersible, by epoxy, were the common ways to integrate megasonic transducers within a treatment tank. One alternative is disclosed by Cook in U.S. Pat. No. 4,527,901, where the ceramic is fired, and then polarized, as part of the tank assembly. Another cited reference alternative to the bonding a piezoelectric shape by epoxy is to mold or cast the piezoelectric shape into the product. For example, some cited references' system utilizes a piezoelectric circle that has been injection-molded into a tank assembly. The cited references also suggests that a piezoelectric rectangle could be cast into a quartz window; however, in this case, poling or repoling the ceramic after casting may be necessary if it exceeds-its curie point.

The megasonic systems of the cited references overcame many of the disadvantages and problems associated with 25 kHz to 50 kHz systems. First, because the energy in each cavitation implosion decreases with increasing frequency, damages due to cavitation implosion have been reduced or eliminated. Instead of cavitation implosion, megasonic systems depend on the microstreaming effect present in ultrasonic fields to give enhanced processing or cleaning. Resonant effects, although theoretically present, are minimal because the geometries of the delicate parts are typically not resonant at megasonic frequencies. As geometries become smaller, however, such as in state-of-the-art equipment, certain cited reference's megasonic systems have had to increase their operating frequencies to 2 MHz or greater.

An alternative to higher frequency megasonics is to optimize the ultrasonic energies with amplitude modulation (AM) of a frequency modulated (FM) wave. Such systems operate by adjusting one of seven ultrasonic generator parameters—center frequency, bandwidth, sweep time, train time, degas time, burst time, and quiet time—to adjust one or more of the following characteristics within the liquid; energy in each cavitation implosion, average cavitation density, cavitation density as a function of time, cavitation density as a function of position in the tank and average gaseous concentration.

When megasonic systems became popular as a solution to cavitation and resonant damages caused by lower frequency ultrasonic systems, the cited references suggest that even higher frequencies be utilized in the removal of smaller, sub-micron particulate contamination. Recent data and physical understanding of the megasonic process, however, suggest that this is not the case. The microstreaming mechanism upon which megasonics depends penetrates the boundary layer next to a semiconductor wafer and relies on a pumping action to continuously deliver fresh solution to the wafer surface while simultaneously removing contamination and spent chemistry. Cleaning or processing with megasonics therefore depends upon (a) the chemical action of the particular cleaning, rinsing, or processing chemistry in the megasonics tank, and (b) the microstreaming which delivers the chemistry to the surface of the part being processed, rinsed, or cleaned.

However, because microstreaming is produced in all high intensity ultrasonic fields in liquids, it can be expected that submicron size particle removal will occur in any high intensity ultrasonic field. When experiments were done where the problems of non-uniformity, high cavitation energy, and resonance were overcome by ultrasonic techniques such as those taught by U.S. Pat. No. 4,736,130, the data showed effective submicron particle removal at all ultrasonic frequencies used for semiconductor wafer cleaning and processing.

One problem with cited references' megasonic systems relates to the transducer design and operation frequency. Incited references' megasonic systems, the commonly available 0.1-inch-thick piezoelectric ceramic shapes are bonded to a typical tank or gasketed plate and have a fundamental resonant frequency in the 600 kHz to 900 kHz frequency range. The main difference between these megasonic transducers and the 25 kHz or 40 kHz transducers is that the lower frequency transducers are clamped systems, i.e., where the piezoelectric ceramic is always under compression, whereas the megasonic transducers are unclamped. Because the megasonic transducers are unclamped, the piezoelectric ceramics go into tension during its normal operation, reducing the transducer's reliability. This remains a significant problem with cited references' megasonic systems.

More particularly, ceramic is very strong under compression, but weak and prone to fracture when put into tension. When a clamped transducer is made, the front driver and the backplate compress the piezoelectric ceramic by means of a bolt or a number of bolts. However, the front driver and the backplate become part of the piezoelectric resonant structure and operate to lower the resonant frequency of the combined part. The cited references' clamped ultrasonic transducer structures resonate at fundamental frequencies well below the megasonic frequencies, and generally at 90 kHz and below.

Therefore, one significant problem with megasonic systems and equipment is overall reliability. The megasonic piezoelectric ceramic is put into tension at 600,000 times per second (i.e., 600 kHz), at least, during operation. This tension causes the ceramics to crack because it weakens and fatigues the material with repeated cycles.

Two other problems of cited references' megasonic systems relate to the nature of high frequency sound waves in a liquid. Sound waves with frequencies above 500 kHz travel like a beam within liquid, and further exhibit high attenuation. This beam effect is a problem because it is very difficult to uniformly fill the process or cleaning tank with the acoustic field. Therefore, the cited references have devised techniques to compensate for the beam effect, such as by (a) spreading the sound around the tank through use of acoustic lenses, or by (b) physically moving the parts through the acoustic beam. The beam and attenuation effects of megasonic systems result in non-uniform processing, and other undesirable artifacts.

In the last ten years, several manufacturers of cited references' ultrasonic systems have introduced frequency-sweeping ultrasonic generators with certain frequencies in the 25 kHz to 72 kHz frequency range. Such systems overcome many of the problems associated in the cited references. By way of example, many or all of the damaging standing waves and resonances are eliminated by these frequency-sweeping ultrasonic systems. These systems reduce resonant damages by sweeping the frequencies fast enough, and over a large enough bandwidth, so that it greatly reduces the likelihood of having resonances within the tank. A rapid frequency sweeping system generates each cycle of sound (or in some cases, each half cycle of sound) at a significantly different frequency from the preceding cycle of sound (or half cycle of sound). Therefore, the buildup of resonant energy required to impart a resonance amplitude within the part rarely or never occurs.

Another advantage of frequency sweeping ultrasonic systems is that they increase the ultrasonic activity in the tank because there is less loss due to wave cancellation. One of the first frequency sweeping ultrasonic generators had a bandwidth of 2 kHz, a sweep rate of 100 Hz, and a center frequency of 40 kHz. Accordingly, at a frequency change 400 kHz per second—i.e., two kilohertz sweeping up from 39 kHz to 41 kHz, plus two kilohertz sweeping down from 41 kHz to 39 kHz, times 100 times per second equals 400 kHz per second—the increased ultrasonic activity was able to cavitate semi-aqueous solvents which were previously impossible to continuously cavitate with commercially available conventional ultrasonic generators.

The frequency-sweeping activity disclosed in the cited references was so significant that by 1991 every major ultrasonic manufacturer was shipping 40 kHz generators that changed frequency at frequency sweep rates of up to 4.8 MHz per second. This rapid sweeping of frequency provided good ultrasonic activity even at continuous wave (CW) operation. By way of example, one 10-kilowatt, 40 kHz generator disclosed in a cited reference operated directly from a rectified three-phase power signal which provided an 800 kHz per second CW frequency-sweeping system that had superior performance as compared to AM single frequency ultrasonic systems.

Although the main problems with lower frequency ultrasonics were solved by frequency sweeping, cavitation damage could occur in any process where the energy in each cavitation implosion was strong enough to remove an atom or a molecule from the surface of the semiconductor wafer or the delicate part. As disclosed in U.S. Pat. No. 4,736,130, system optimization at lower frequency ultrasonics permitted successful processing of many delicate parts because it was possible to maximize the microstreaming effects while minimizing adverse cavitation effects. However, the potential for cavitation damage remains a concern of the industry.

One important limitation to further improvement of ultrasonic processes is the low frequency and the narrow bandwidth of clamped piezoelectric transducers. For example, typical clamped or unclamped transducers provide about 4 kHz in overall bandwidth. One other important limitation of ultrasonic processes is that although amplitude control is known to be beneficial, inexpensive, and uncomplicated ways of providing AM are generally not available.

Other problems exist in the cited references in that certain systems are driven by more than one ultrasonic generator. Such generators typically operate to either (a) drive the same tank, or (b) drive multiple tanks in the same system. Although the generators are typically set to the same sweep rate, the independent generators will never have exactly the same sweep rate. This causes another low frequency resonance problem within an ultrasonic tank or system. In addition, one problem with multiple tanks and multiple generators is that some of the ultrasound from one tank is coupled through connecting structure to the other tank(s). This creates unwanted crosstalk and negatively affects the desired cleaning or processing within the tank.

In particular, the cited references' multi-generator systems sometimes create an undesirable beat frequency which causes low frequency resonance in susceptible parts. For example, consider two sweeping frequency generators, each with sweep rates of approximately 10 Hz sweeping over a bandwidth of 4 kHz with a center frequency of 40 kHz. Now consider a delicate part to be cleaned that has a low frequency resonance at one kilohertz. The following condition will occur periodically; one generator will be changing frequency from 38 kHz to 41 kHz, while the other generator is changing frequency from 39 kHz to 42 kHz. In this example, this will occur for about 37.5 milliseconds. Since the two frequencies in the tank or system are about one kilohertz apart, a beat frequency of about one kilohertz is produced. The period of one kilohertz is one millisecond, therefore a string of thirty-seven beats at about one kilohertz are produced. This is sufficient to setup a destructive resonance in a delicate part with a one kilohertz resonance."

It is also known that the most common type of variable inductor today is one with a moveable ferrite magnetic core, which can be slid or screwed in or out of the coil. Moving the core farther into the coil increases the permeability, increasing the magnetic field and the inductance.

It is, therefore, an object of the invention to provide ultrasonic systems which reduce or eliminate the problems in the cited references.

SUMMARY OF THE INVENTION

A system for delivering ultrasonic energy to a transducer load has at least one ultrasonic transducer, and a radio frequency (RF) generator for delivering RF power to the transducer load. The RF generator has an output circuit that has at least one tunable resonant frequency, a voltage circuitry system that senses an output voltage waveform, a current circuitry system that senses an output current waveform, a phase detector circuit for measuring a phase differential between the output voltage waveform and the output current waveform, wherein the phase detector circuit has an XOR gate that receives a voltage signal input and a current signal input, a low pass filter to convert the output of the XOR gate to a DC signal, an ADC to convert the DC signal into a digital signal, a comparator that compares the measured phase to a desired phase goal to produce updated positioning instructions for an adjustable inductor, and a motor controller evaluates the updated positioning instructions and then automatically repositions or maintains the position of a moveable metallic core within a variable inductor, to generate a desired ultrasonic transmission in a liquid wherein the voltage and current phases at the output of the power transistors are approximately aligned. The comparator can be comprised of firmware, software, hardware, or any combination thereof.

BRIEF DESCRIPTION OF THE FIGURES

A more complete understanding of the invention may be obtained by reference to the drawings, in which.

DETAILED DESCRIPTION OF THE INVENTION

Definitions

Figure 1A:
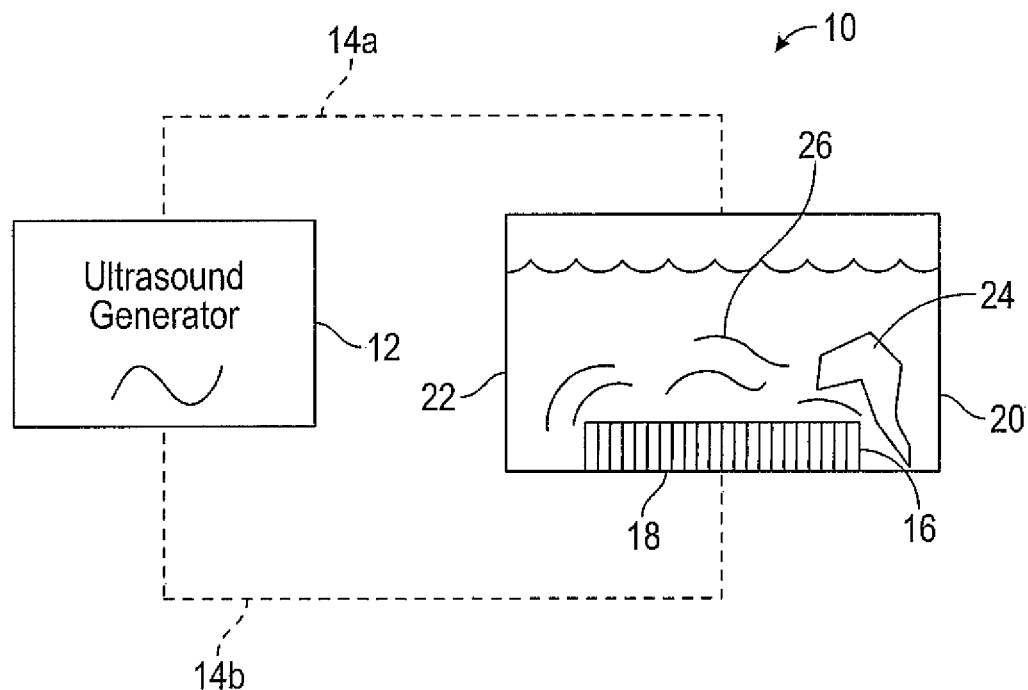
FIG. 1A shows a cut-away side view schematic of an ultrasound processing system constructed according to the invention.

As used herein, "ultrasound" and "ultrasonic" generally refer to acoustic disturbances in a frequency range above about eighteen kilohertz and which extend upwards to over two megahertz.

"Lower frequency" ultrasound, or "low frequency" ultrasound mean ultrasound between about 18 kHz and 90 kHz. "Megasonics" or "megasonic" refer to acoustic disturbances between 600 kHz and 2 MHz. As discussed above, the cited references has manufactured "low frequency" and "megasonic" ultrasound systems. Typical low frequency systems, for example, operate at 25 kHz, 40 kHz, and as high as 90 kHz. Typical megasonic systems operate between 600 kHz and 1 MHz. Certain aspects of the invention apply to low frequency ultrasound and to megasonics. However, certain aspects of the invention apply to ultrasound in the 100 kHz to 350 kHz region, a frequency range which is sometimes-denoted herein as "microsonics."

"Autotuning" is sometimes called "automatic tuning", "tuning", "controlled tuning", "controllable tuning", "regulated tuning", "automated electromechanical tuning", "automated tuning", or a variety of related terms that mean autotuning from context.

As used herein, the generator's DC voltage rails that supply the RF output transistors are sometimes labeled as V+ and V−, or sometimes called, respectively, DC+ and DC−.

As used herein, the phrase "integrated circuit" can be written as "IC", "SOIC" "chip", and/or "microchip."

"Output tuning" and "tuning" mean the process of adjusting the output waveforms so that the waveforms' phases are approximately aligned along the time axis. This is also called "phase alignment." Sometimes, for selected generator frequencies, there is an intentional non-zero phase offset employed that is programmed into an autotuning system.

"Output inductor" and "tuning inductor" are the same, and sometimes are referred to as "inductor", "L", "$L_{OUTPUT}$", "$L_{TUNING}$", "$L_{SERIES}$" or "$L_{TUNE}$." This is the inductance that is used for output tuning so that the phases of V and I can be aligned optimally. It is referred to here as inductance 303, as a property of an electric circuit.

The physical device (coil of wire, for example) for creating the tuning inductance is called "inductor" 421. The variable inductor described herein comprises the inductor 421, core 422, and coupling mechanism 420.

"Output transformer" is sometimes referred to as "transformer" and refers to the RF output transformer of the generator.

"Mains", "wall voltage", "autotransformer", "line" and "line voltage" refers to the source of alternating current (AC) power in the usual sense, as a source of current and voltage to be connected to the input of the ultrasonic generator.

The output frequency of the generator can be represented in various ways, including, as examples: $f_{out}$, $f_0$, $f_0$, $f$, $\omega$, or $\omega_0$.

As used herein, "kHz" refers to kilohertz and a frequency magnitude of one thousand hertz. "MHz" refers to megahertz and a frequency magnitude of one million hertz.

As used herein. "RF" refers to radio frequency refers to a frequency ranging from 18 kHz to about 5 MHz.

As used herein, the terms "board," "PC Board," "PC," and "PCB" all refer to any of the following: assembled printed circuit boards, unassembled printed circuit boards, partially assembled printed circuit boards, or the board itself, without any components.

As used herein, "resonant transducer" means a transducer operated at a frequency or in a range of frequencies that correspond to a one-half wavelength (k) of sound in the transducer stack. "Harmonic transducer" means a transducer operated at a frequency or in a range of frequencies that correspond to 1λ, 1.5λ, 2λ or 2.5λ of sound, and so on, in the transducer stack. "Bandwidth" means the range of frequencies in a resonant or harmonic region of a transducer over which the acoustic power output of a transducer remains between 50% and 100% of the maximum value.

As used herein, a "delicate part" refers to those parts which are undergoing a manufacture, process, or cleaning operation within liquid subjected to ultrasonic energy. By way of example, one delicate part is a semiconductor wafer which has extremely small features and which is easily damaged by cavitation implosion. A delicate part often defines components in the computer industry, including disk drives, semiconductor components, and the like.

The primary DC power voltage (or "rail voltage") of a digital subsystem is called Vdd, and is sometimes called Vcc or Vss.

"Phase differential" or "differential" or "difference" or sometimes the word "phase," refer to the phase difference between the voltage and current waveforms at the selected nodes and branches in the RF circuit while using a consistent time base. Phase differential can also refer to the "difference between two phase differentials," for example, between the phase differential of I and V for one set of measurements as compared to the differential between I and V for another set of measurements (or as compared to the desired difference in phase between I and V). Usage (and units) can be inferred from context.

The units of phase depend on context, and can be angular degrees, radians, ADC output units or "counts," ADU, or units of stepper steps, among others.

The word "count" (or "counts" or "digital count") usually refers to the digital output of an ADC, but can also refer to other values, such as stepper steps, among others. The count is usually expressed at a high level in base-10 integers, and the raw ADC output is binary. The meaning of "count" for a given instance can be inferred from context.

"Phase goal" is a number entered into EPROM by an engineer or technician. There is a phase goal for each output frequency $f_0$ of a generator. It is a stored variable that represents the desired endpoint (target endpoint, desired convergence point) of the feedback-controlled phase differential between I(t) and V(t). It has a value based on the digital output range of the ADC used for sampling the output of the phase detector. The phase goal is stored in EPROM of the first microcontroller and is retrieved by the first microcontroller upon start-up of the generator. An alternative phrase for phase goal is "phase difference set point" (or "phase set point"). The phase goal can be set to a value that corresponds to I(t) and V(t) being substantially in phase or set to values where I(t) and V(t) are a specified amount out of phase.

The "phase value" is the difference between the stored value of the phase goal and measured phase difference between the current and voltage waveforms. In this example, "phase value" is in ADC units. It represents the error that is used by the control loop to determine the updated position for the ferrite core. The phase value is subsequently scaled to stepper units for electromechanically moving the ferrite core within a variable inductor. The scaled value of a phase value can be represented by the firmware variable "phase_steps." The comparison of the measured phase differential to the phase goal can be firmware based, software based, hardware based, or a combination thereof. Phase value is sometimes called "phase difference" or "phase error."

The "position" is an integer stored in EPROM (and retrieved by one or more controllers upon start-up). The position value is updated based on the last position the ferrite core has reached for a given output frequency $f_0$. It is sometimes called "x-position," because the axis of travel of the ferrite core is called the x-axis. As one example, the position is represented by a firmware variable called "default_stepper" and is updated by the newly determined number of phase steps (firmware variable "phase_steps") if a newly calculated position is more than a threshold distance away from the present "default stepper" value. For this example, the units are stepper units, also known as "steps." The "position" is sometimes referred to "position information," "position signal," "count signal," or "position value."

The phrase "output circuit" (or "RF output circuit") of a generator, as used herein, refers to the voltage output and current output of the generator's power transistors when the generator is connected to a load.

A ferrite "core" is sometimes referred to as a "plug" or "rod."

The generator's "output transistors" are also called "power transistors."

The memory unit(s) can be RAM, ROM, EPROM, or combination, variations, or derivatives thereof. Memory units can be internal to the autotuning system's microcontrollers and CPLD, or external. For specific examples listed herein, it is understood that the invention can be implemented with a variety of read, write, and storage methods. For CPLDs, other types of programmable logic devices can be used.

Reaching convergence of the loop on the phase goal (for a given $f_o$), and maintaining the convergence condition, is also called "lock."

The combination of the XOR phase detector 660, low pass filter 412, and buffer 413, is also called the "phase detector" 900 or "phase detector system" 900.

Herein, the word "controller" has the same meaning as "microcontroller," in that a controller is an IC (or group of IC's) that supports the control functions. As an example, the microcontroller functions (or controller) could be implemented, in principle, with an FPGA or with FPGA's. For this disclosure, the realization of control loops for the autotuning of ultrasonic generators is not restricted to the components—or types of devices—used in the examples.

RF Generators and Piezoelectric Loads

Figure 1B:
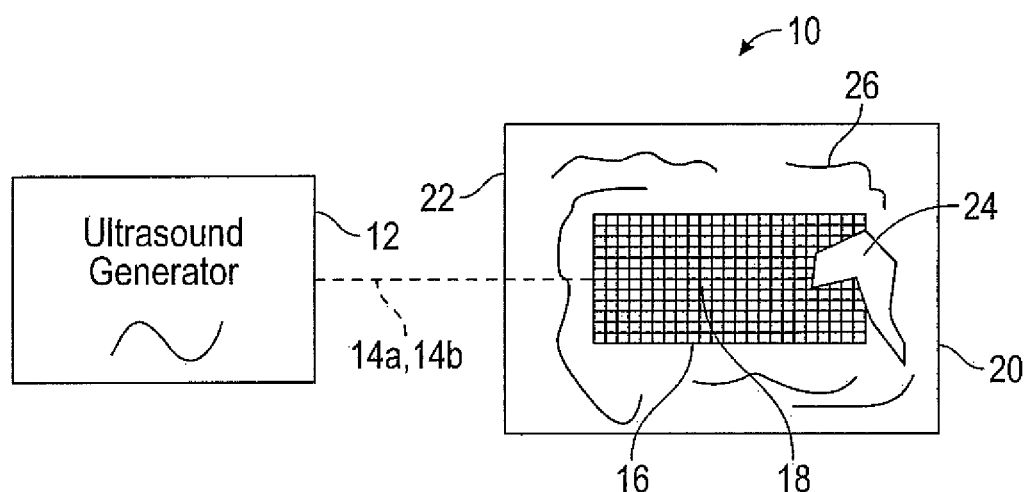
FIG. 1B shows a top view schematic of the ultrasound system of FIG. 1A.

Ultrasound systems have one or more ultrasonic generators for driving radio frequency (RF) electrical power to the transducer load. For an overview, a block diagram is shown at FIGS. 1A and 1B. FIGS. 1A and 1B show schematic side and top views, respectively, of an ultrasound processing system 10 constructed according to the invention. An ultrasonic generator 12 electrically connects, via electrical paths 14a, 14b, to an ultrasound transducer 16 to drive the transducer 16 at ultrasound frequencies above about 18 kHz, and usually between 40 kHz and 350 kHz. Though not required, the transducer 16 is shown in FIG. 1 as an array of transducer elements 18; with the understanding that the illustrated array could also be a single transducer element.

Typically, the array of transducer elements 18 are made from ceramic, piezoelectric, or magnetostrictive materials which expand and contract with applied voltages or current to create ultrasound. The transducer 16 is mounted to the bottom, to the sides, or within the ultrasound treatment tank 20 through conventional methods, such as known to those skilled in the art and as described above. A liquid 22 fills the tank to a level enough to cover the delicate part 24 to be processed and/or cleaned. In operation, the generator 12 drives the transducer 16 to create acoustic energy 26 that couples into the liquid 22. That means, the applied uses of ultrasound energy, and in particular the application and control of ultrasonic energy to clean and process delicate parts, e.g., semiconductor wafers, within the liquid is a desirable objective. Generally, in accord with the invention, one or more ultrasonic generators drive one or more ultrasonic transducers, or arrays of transducers, coupled to a liquid to clean and/or process the delicate part. The liquid is preferably held within a tank; and the transducers mount on or within the tank to impart ultrasound energy into the liquid.

Although the transducer 16 is shown mounted to the bottom of the tank 20, those skilled in the art will appreciate that other mounting configurations are possible and envisioned.

Figure 2A:
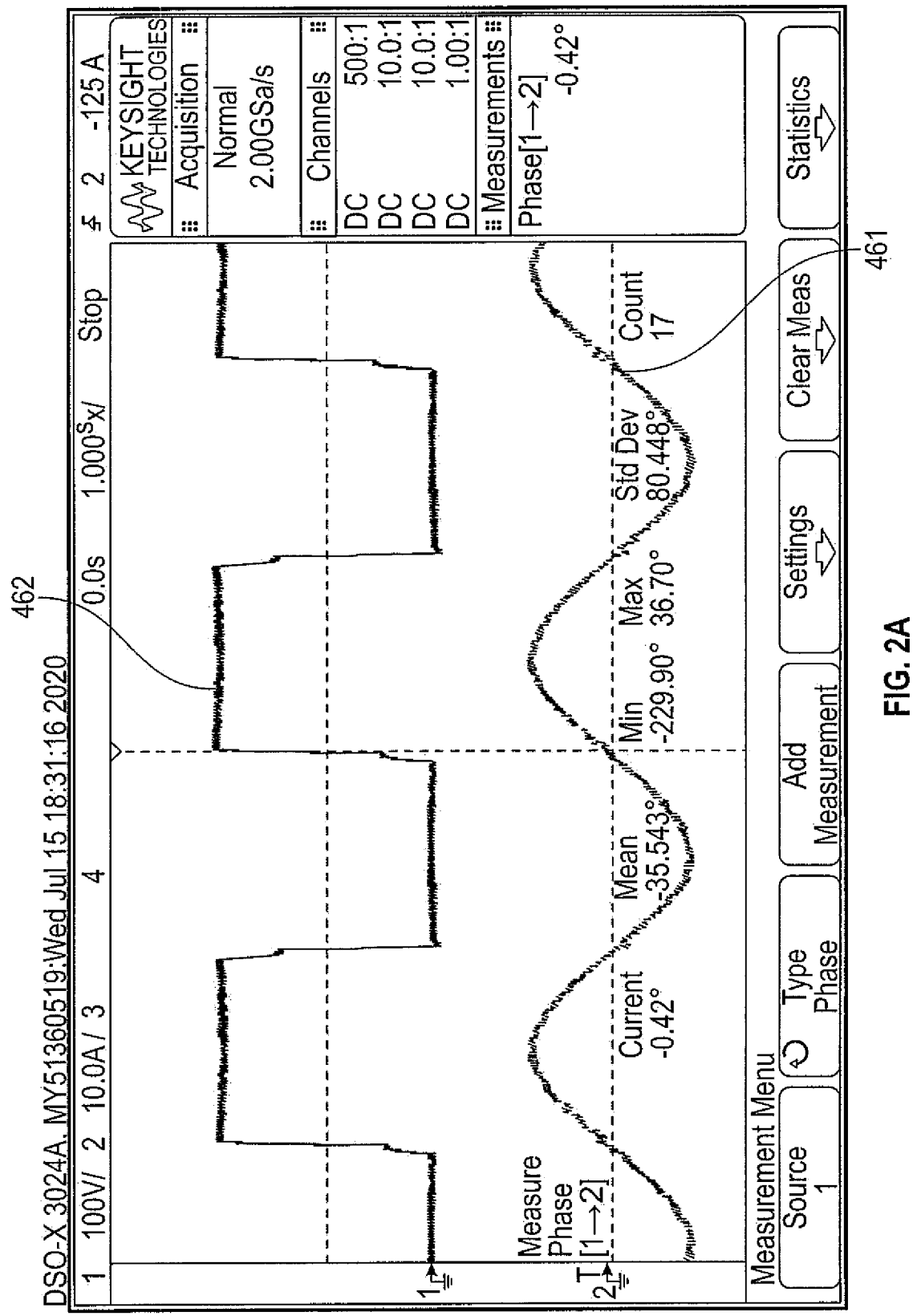
FIG. 2A shows voltage and current waveforms, triggered together and on the same time scale to show alignment when an ultrasound system is in tune to less than one-degree of phase differential.
Figure 2B:
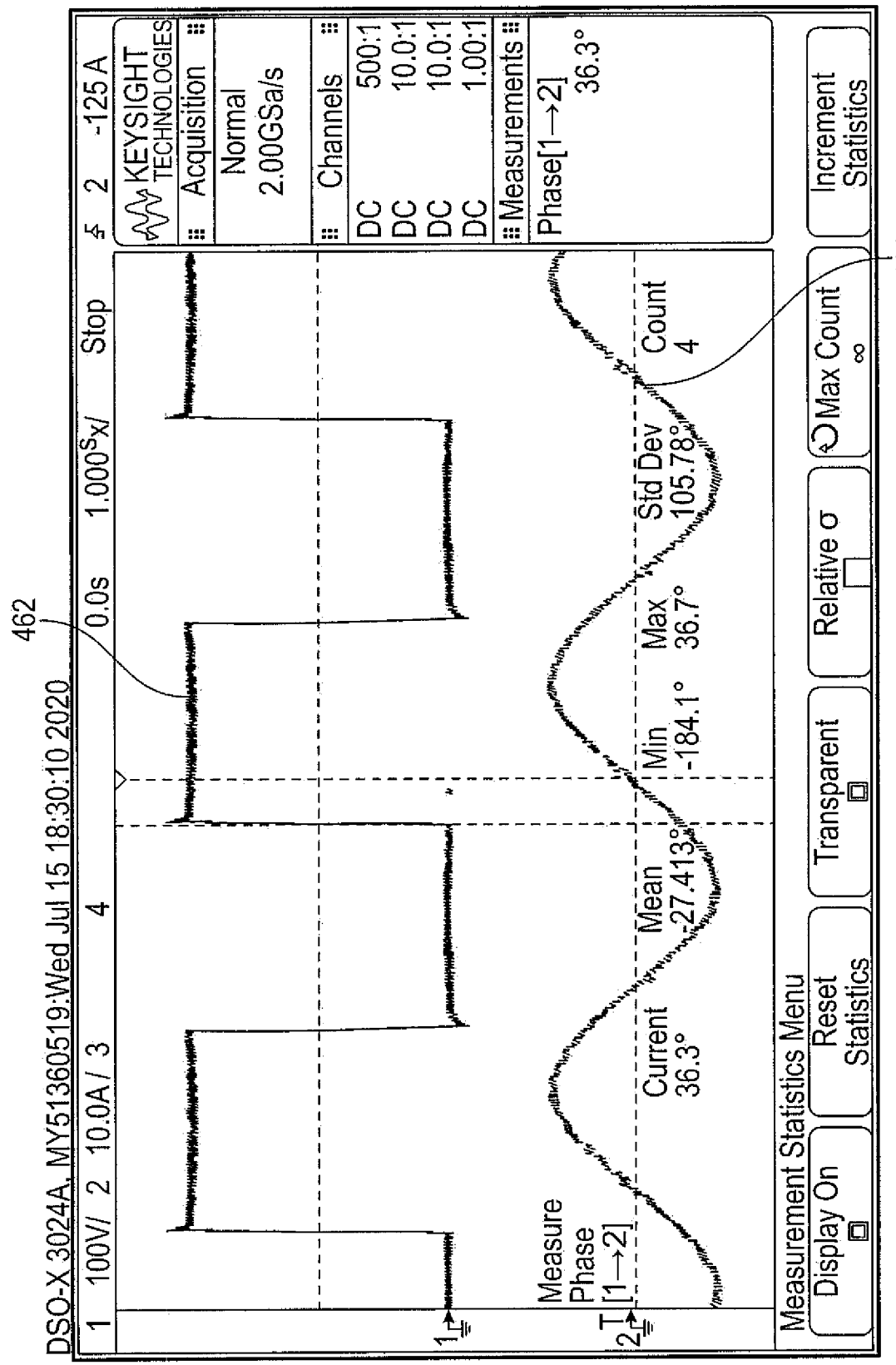
FIG. 2B shows voltage and current waveforms, triggered together and on the same time scale, to show alignment when an ultrasound system is tuned to about 30 degrees of phase differential, with current leading the voltage.
Figure 2C:
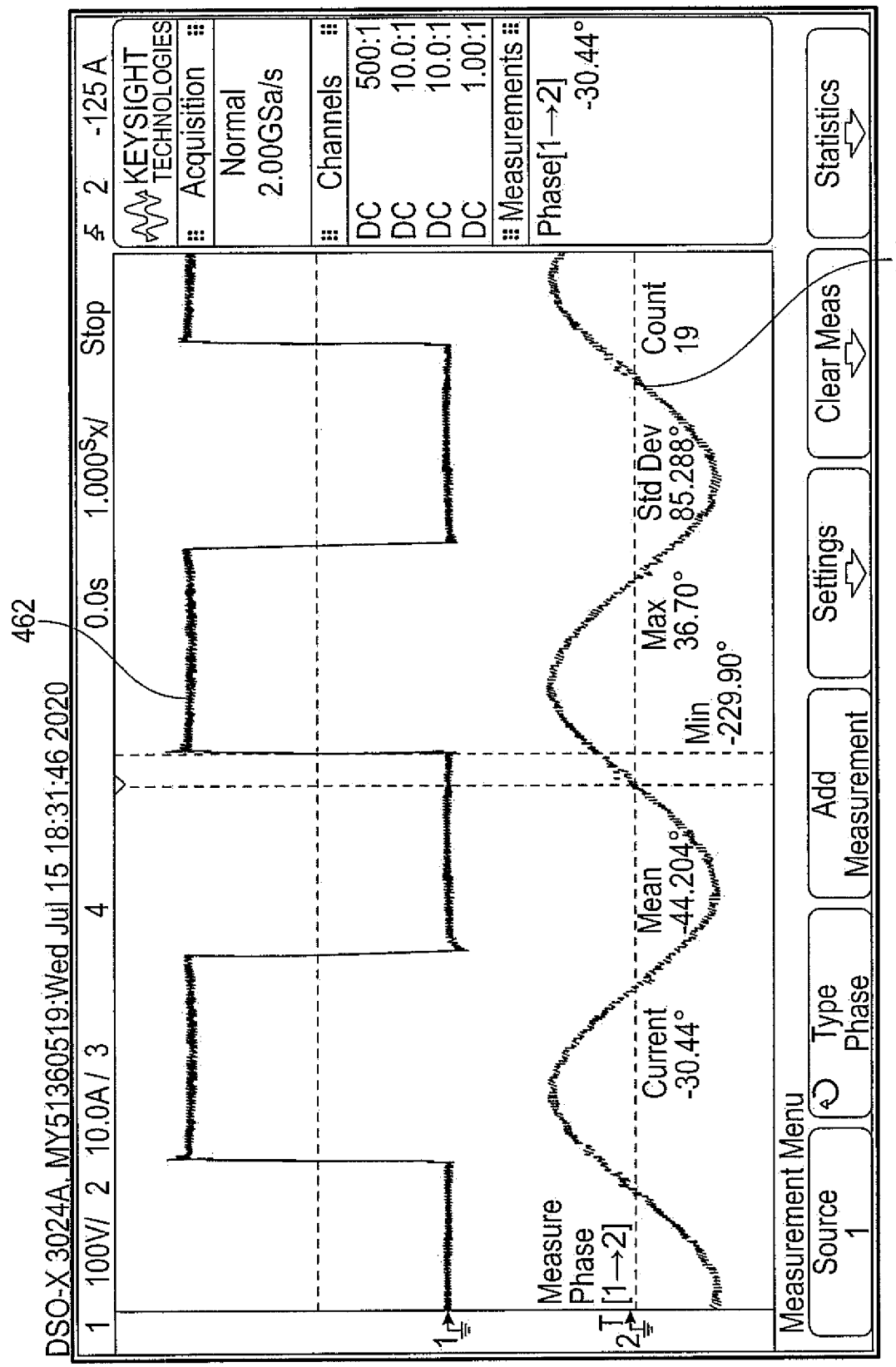
FIG. 2C shows voltage and current waveforms, triggered together and on the same time scale, to show alignment when an ultrasound system is tuned to about 30 degrees of phase differential, with current lagging the voltage.

RF Output of Generator—Waveforms:

As identified above, prior generator systems have had difficulties meeting performance guidelines without undergoing a time-consuming hands-on tuning procedure to align a generator's output voltage and output current RF waveforms. Examples are presented in FIGS. 2A, 2B, and 2C that show current and voltage alignments that were measured using an embodiment of the invention described herein, as waveforms displayed on an oscilloscope. In each FIG. 2A, FIG. 2B, and FIG. 2C, the voltage waveform 462 is shown as a top trace and the current waveform 461 is illustrated as a bottom trace. FIG. 2A illustrates an example of an alignment of voltage 462 and current 461 showing a phase differential of less than one degree between I(t) 461 and V(t) 462, at 260 kHz. FIG. 2B illustrates an example of a "30-degree" alignment showing current 461 leading voltage 462 with a phase differential of +36.3 degrees between I(t) 461 and V(t) 462, at 260 kHz. FIG. 2C illustrates an example of a "30-degree" alignment showing current 461 lagging voltage 462 with a phase differential of −30.4 degrees between I(t) 461 and V(t) 462, at 260 kHz.

The voltage and current waveforms for the examples in FIGS. 2A, 2B, and 2C were measured at the output of the generator's power transistors (also called "the input to the output transformer 429"), as $V_{OUTPUT}(t)$ 462 and $I_{OUTPUT}(t)$ 461. Note that $V_{OUTPUT}(t)$ and $I_{OUTPUT}(t)$ are sometimes referred to as V(t) 462 and I(t) 461, when the context is clear. For purposes of tuning the circuit (for aligning the output waveforms 461, 462), alternative voltage and current waveforms may be sensed from a variety of circuit branches and nodes in the generator-load system if the waveforms associated with these alternative branches and nodes are suitable representations of the waveforms associated with $V_{OUTPUT}(t)$ 462 and $I_{OUTPUT}(t)$ 461.

Manual Tuning and Automatic Tuning

A generator sometimes has at least one tuning inductor at its output to improve power efficiency. The value of the inductor is elected depending on the output frequency of the generator and a load's impedance. As a given system is tested, the inductor is (sometimes) adjusted by adding or removing turns of wire. The optimization of the inductor is referred to as "tuning" and generally is done semi-empirically, manually (hands-on), by a technician or engineer for every ultrasound system at various points in a given ultrasound system's lifetime.

Therefore, an object of the invention is to provide ultrasonic systems that have generators capable of automatically tuning the output circuit and/or automatically controlling the tuning of the output circuit so that voltage and current phases are approximately aligned as illustrated at FIG. 2A; and alternatively positioned between the "30-degree" alignments illustrated at FIGS. 2B to 2C.

Figure 3A:
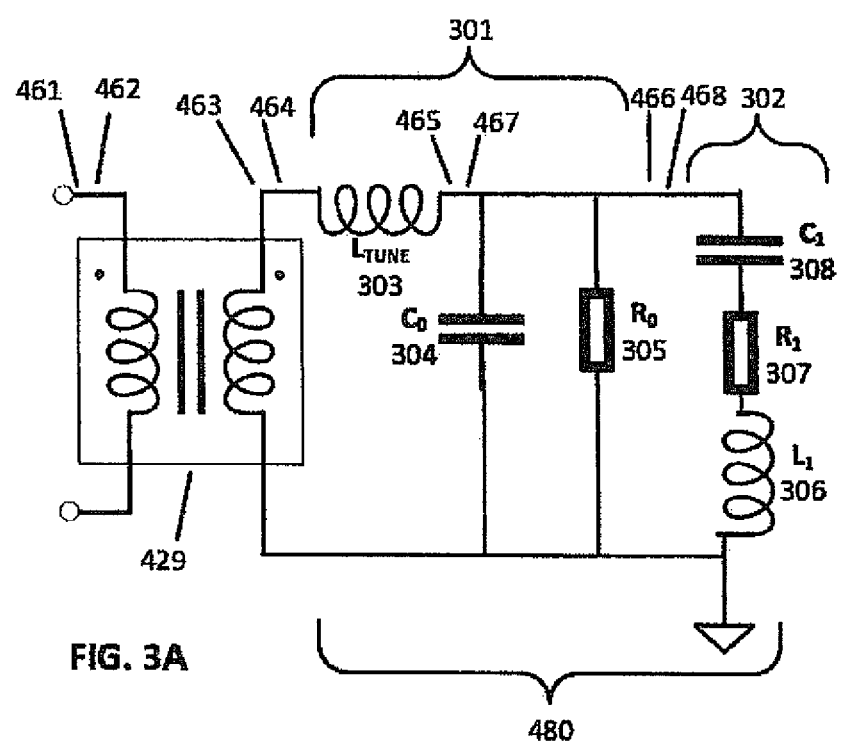
FIG. 3A is a schematic showing the load as two coupled resonant circuits: a mechanical LCR circuit and an electrical LCR circuit.

Generator Output and Load as an LCR Circuit:

The output impedance of an ultrasonic generator together with its load 480 can be represented as an LCR resonant circuit as illustrated at FIG. 3A, wherein "L" is the circuit's inductance, "C" is the circuit's capacitance, and "R" is the circuit's resistance. The load 480 can be represented by two coupled resonant circuits comprising an electrical resonance 301 and a mechanical resonance 302. The mechanical resonance 302, being comprised of transducers with piezoelectric elements, can be represented as an assemblage with series electrical elements $L_1$, $C_1$, and $R_1$, as shown in FIG. 3A. For the overall LCR resonant circuit that represents the output and load of an ultrasonic generator, L comprises the tuning inductance $L_0$ 303 plus the inductance $L_1$ 306 of the mechanical resonance 302. The inductance L also includes the output inductance of the generator's output transformer 429. The inductance at the output of the generator's output transformer is sometimes referred to as the "leakage inductance at the transformer's secondary" and is sometimes called "stray inductance." The capacitance C comprises the capacitance-below-resonance of the transducer array $C_0$ 304. This capacitance $C_0$ is the parallel plate capacitance of the transducer array, plus any stray capacitance associated with this parallel plate capacitance. In addition, other circuit capacitance contributes to C. For example, C includes, but is not limited to, the capacitance $C_1$ 308 of the mechanical resonance 302 at or near the load's resonance frequency, plus any other stray capacitance. The total resistance R comprises the overall resistance of the load 480 and generator's output impedance, including any parasitic resistances.

Phase alignment is measured by comparing the current and voltage waveforms at circuit nodes at the output generator's power transistors. Other circuit branches and nodes can be used for sensing the current and voltage waveforms. In one example, the current and voltage waveforms are measured at the output transformer's secondary windings. In another example, voltage waveforms are taken directly from gating pulses that drive the output transistors. In another example, the current waveform is represented by a voltage waveform, obtained using a feedback current transformer near the output of the power transistors before the output transformer.

As understood by those in the art, an ultrasound system 10 is comprised of an RF generator 12 with hardware and software for delivering and controlling electrical power, and a load that is comprised of a piezoelectric transducer array containing at least one transducer 18 (see, FIGS. 1A and 1B). Typical transducer arrays contain numerous transducers, in many instances up to 48 or more, and thus the total load capacitance depends on the specific system and the tolerances of its transducers. The objective in the design of a generator is to make the frequency of the electrical resonance 301 nearly equal to the frequency of the mechanical resonance 302—in other words, nearly equal to the piezoelectric resonant frequency of the transducer array. Tuning, by adjusting the electrical resonance 301 to align the phases of the current (I) and voltage (V) waveforms, as measured at or near the output transistors, improves the power efficiency further.

Thus, the value of the tuning inductance for an ultrasonic cleaning system varies from system-to-system and depends mostly on: (1) the resonant frequencies of the individual tank-bonded transducers 18 prior to connection to the array; (2) the total capacitance of the transducer load; and (3) the leakage inductance of the output transformer, looking backwards towards the transformer's secondary terminals, i.e., from the point of view of the transformer's output. Thus, it would be useful to have electromechanical tuning and/or automated tuning control to match the generator to its load with little, if any, human interaction during tuning.

Therefore, an object of the invention is to provide ultrasonic systems which have generators capable of automatically tuning the output circuit (and/or automatically controlling the tuning the output circuit) so that voltage & current phases are approximately aligned. Optimum phase, when the optimum amount of ultrasonic power is delivered to a tank, sometimes occurs when the current and voltage are slightly out of phase. This can be addressed by storing the phase goals (targets) according to each specific $f_0$ frequency, in ROM, so that they are retrieved as initial data during start-up. In sum, the phase goal is a target endpoint for the phase difference that corresponds to optimum performance for the ultrasound application. The phase goal can be set, as desired, for each of the generator's operating frequencies. These optimized phase goals are not necessarily zero-degree (nor near-zero-degree) phase differentials, yet many times are zero or nearly zero degrees.

FIG. 3A illustrates fundamental tenets for an apparatus and method for automatically adjusting the tuning of a LCR resonant circuit at the output of the generator 12 so that its current and voltage phases are aligned to approximately within 30 degrees (see FIG. 2B for about +30 degrees and FIG. 2C for about −30 degrees). A present implementation of the invention successfully achieves about zero degrees of alignment routinely as illustrated at FIG. 2A. That means the I(t) and the V(t) traces can be fully aligned, within an acceptable measurement error. The function of the generator will be acceptable with I and V alignments within ±30 degrees.

In sum, the combination of an LCR electrically resonant circuit 301 and an LCR mechanically resonant circuit 302 (the piezoelectric resonance), plus stray capacitances and inductances can represent the generator's load 480. Piezoelectric resonances represent a coupled interaction of electrical and mechanical properties of the piezoelectric material, so the "mechanical resonance" 302 itself is represented—in an electrical context—as a series LCR circuit. Tuning, in the context of the aligning the current and voltage phases, involves tuning the electrically resonant circuit 301 to near the mechanical resonant frequency with a series or parallel inductance, $L_{TUNE}$ 303 (sometimes referred to as $L_{SERIES}$ or $L_0$, or $L_{PARALLEL}$). In this way, two coupled resonant circuits are used for understanding the load: the first resonant circuit is the mechanical resonant circuit 302 governed by $L_1$ 306, $C_1$ 308, and $R_1$ 307, and the second resonant circuit is the electrically resonant circuit 301 governed by $L_{TUNE}$ 303, $C_0$ 304, and the resistance $R_0$ 305.

It is also understood from FIG. 3 that the mechanical resonant circuit 302 (of $C_1$, $L_1$, and $R_1$) is represented as $$\frac{\cdot}{\cdot} = \text{the mechanical resonance as a series } LCR; \text{and}$$

$$|Z|_{MIN} \text{ corresponds to } f_{SERIES} = \frac{1}{2\pi}\sqrt{\frac{1}{L_1 C_1}} = \text{the mechanical}$$

resonant frequency. From that information, it can be determined that $f_{OUTPUT} \approx f_{SERIES}$, where $$f_{OUTPUT} = \frac{1}{2\pi}\sqrt{\frac{1}{L_{TUNE} C_0}}$$

so the tuning resonance is near the mechanical resonance. That means, the tuning resonance is, or should be near, the mechanical resonance, but not necessarily (or always) at the mechanical resonance. For example, the tuning resonance to could be up to 2000 Hz away (higher in frequency or lower in frequency) from the mechanical resonance, and the ultrasound system could nevertheless provide ultrasonic energy to an ultrasonic load. In sum, the electrical resonance frequency that is defined by $L_{TUNE}$ 303, $C_0$ 304, and $R_0$ 305 does not need to be equal to the mechanical resonance frequency, yet equal can often be suitably functional for an ultrasound system. In practice, for many cases the best tuning of the electrical resonance frequency is preferably a little higher in frequency than the mechanical resonance. The phrase "a little higher" in frequency means the electrical resonance frequency ranges from 0.01% to about 20% greater than the frequency of the mechanical resonance. In an alternative embodiment, the phrase "a little higher" in frequency means the electrical resonance frequency ranges from 0.01% to about 10% greater than the frequency of the mechanical resonance. In another alternative embodiment, the phrase "a little higher" in frequency means the electrical resonance frequency ranges from 0.01% to about 5% greater than the frequency of the mechanical resonance. In a further alternative embodiment, the phrase "a little higher" in frequency means the electrical resonance frequency ranges from 0.01% to about 1% greater than the frequency of the mechanical resonance.

It should be noted that in some instances, the phrase "tuned at or tuned a little higher" does not mean that the electrical resonance frequency cannot be below the frequency of the mechanical resonance, since respective frequencies can fluctuate. By understanding that frequencies can fluctuate, that phrase merely conveys a desired setting for the tuned frequency, which means that the tuned electrical resonance frequency could, in some instances, be below the frequency of the mechanical resonance and still obtain the desired results of the instant invention.

RF Output of Generator, Further Details:

Now, consider the generator's output transistors. The RF output can be achieved by a half-bridge or by an H-bridge 401 (e.g., as two half-bridges). The output circuit is sometimes referred to as the output of the "full bridge," however, the invention is not limited to full-bridge, half-bridge, and H-bridge outputs. Current and voltage waveforms associated with the RF output circuit can be used for phase measurement and loop control. And, other circuit nodes and branches can be used for phase measurement and loop control, not only at the nodes and branches described in this disclosure. The outputs waveforms of the full bridge, as applied to the primary windings of the output transformer, are called $I_{PRIMARY}(t)$ 461 and $V_{PRIMARY}(t)$ 462, or simply I(t) 461 and V(t) 462, respectively. Herein, for RF currents and voltages at various circuit locations in the generator, when the context is clear, the shorthand I and V are used to represent I(t) and V(t).

In one embodiment, an H-bridge 401, comprised of four power-FET transistors, provides an output square wave V(t) 462 that is fed into an output transformer 429 for step-up or step-down. (Note that other types of power semiconductor devices can be used, other than power FETs.) The $I_{TRANSDUCER}(t)$ 465 associated with V(t) 462 is substantially sinusoidal when the generator is connected to a typical RLC transducer load.

Figure 3B:
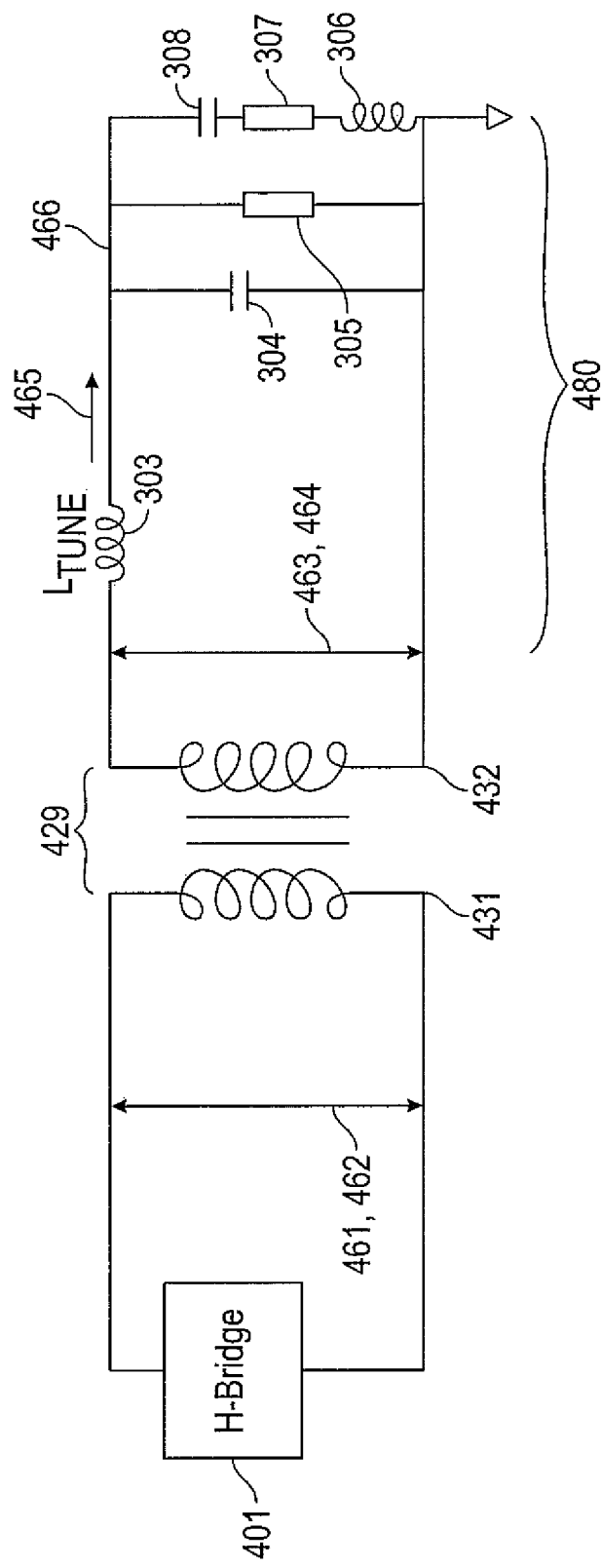
FIG. 3B is a schematic showing an H-bridge, RF output circuit, and load, as an alternative representation of features in FIG. 3A.
Figure 4A:
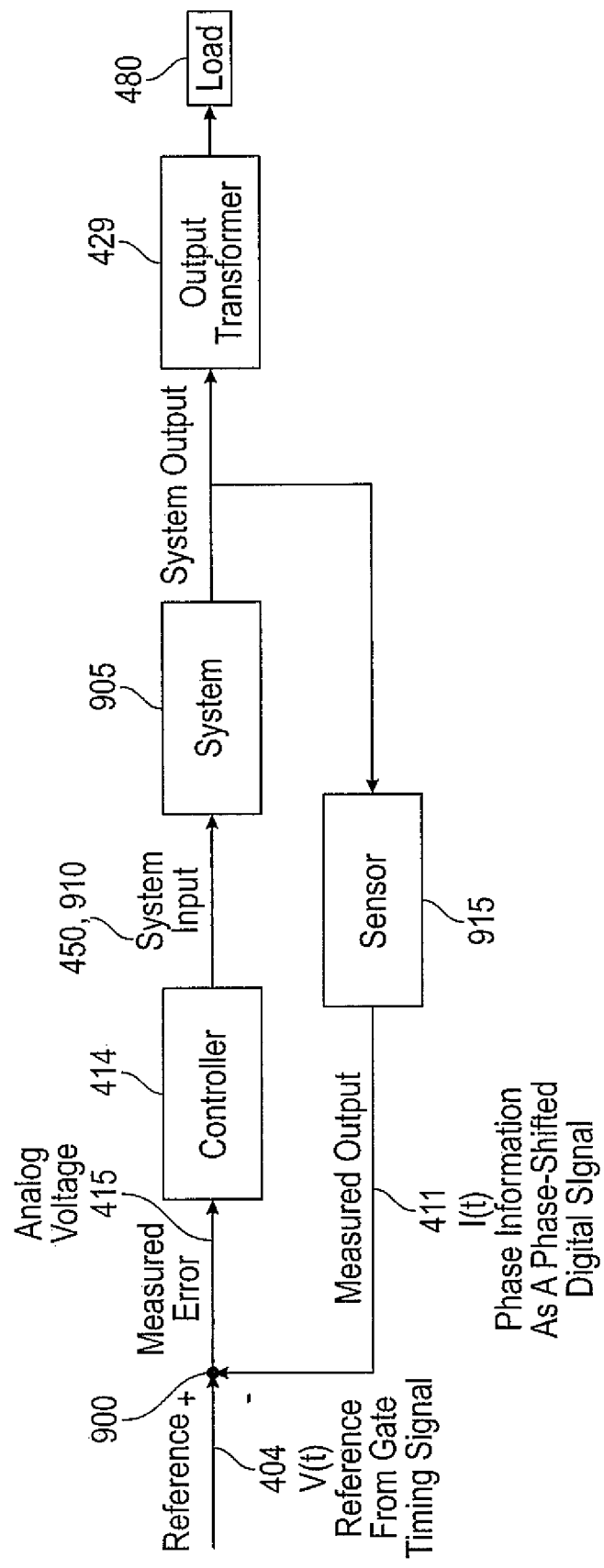
FIG. 4A illustrates a flow chart of an ultrasound system capable of autotuning its generator to its load.
Figure 4B:
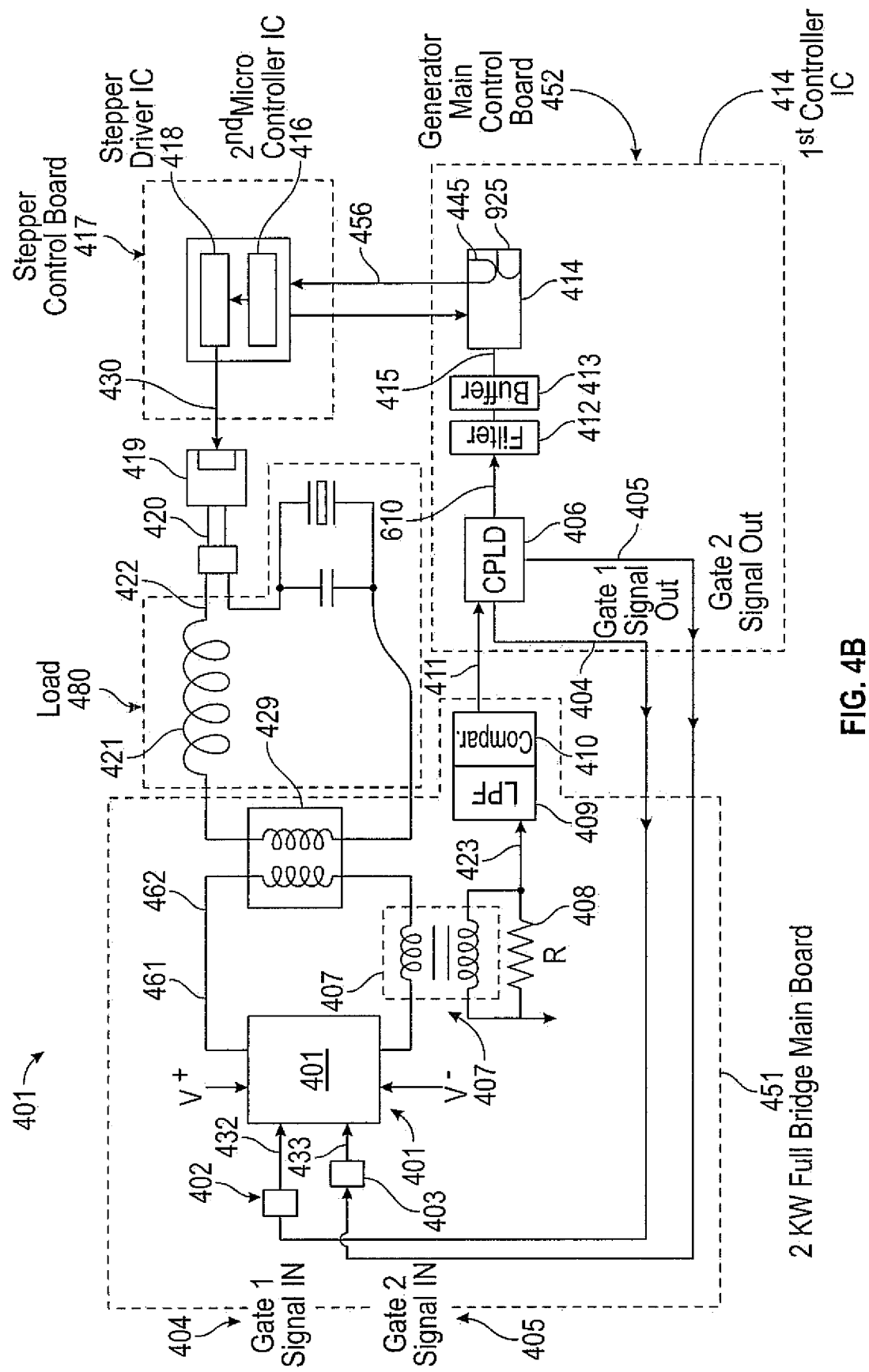
FIG. 4B shows a block diagram of an ultrasound system capable of autotuning its generator to its load.

Referring further to FIG. 3A, FIG. 3B, and FIG. 4B, the output transformer 429 has two input terminals 431 and two output terminals 432. Current output 461 and voltage output 462 of the FET power transistors in the full-bridge circuit 401 connect to the primary windings (input windings) of an output transformer 429. These input waveforms to the output transformer 429 are called $I_{PRIMARY}(t)$ 461 and $V_{PRIMARY}(t)$ 462, and sometimes are referred to as $I_{OUT}(t)$ 461 and $V_{OUT}(t)$ 462, or I(t) 461 and V(t) 462. The output waveforms of the output transformer 429 are called $I_{SECONDARY}(t)$ 463 and $V_{SECONDARY}(t)$ 464, and sometimes are referred to as I(t) 463 and V(t) 464. The current waveform at circuit branch 467 is called $I_{TRANSDUCER}(t)$ 465, and the voltage waveform at voltage node 468 is called $V_{TRANSDUCER}(t)$ 466.

FIG. 3B shows for another view of some of the details in FIG. 3A. Here the output of the H-bridge 462, $I_{PRIMARY}(t)$ 461 and $V_{PRIMARY}(t)$ 462, is shown connected to the primary windings 431 of the output transformer 429. The secondary windings 432 of the output transformer 429 are shown connected to the load 480. The current in the secondary windings $I_{SECONDARY}(t)$ 463 and the voltage across the secondary windings $V_{SECONDARY}(t)$ 464 are labeled as shown. The transducer current and transducer voltage, $I_{TRANSDUCER}(t)$ 465 and $V_{TRANSDUCER}(t)$ 466, are defined herein at the indicated branch 467 and node 468, on the transducer side of the tuning inductance 303.

In examples for circuits for this invention, gate driver ICs 402, 403 are used to drive IGBTs, power FETs, or other power devices. In this example, one of two voltage timing signals 404, 405 for driving the gates of the FETs, originate in a complex programmable logic device (CPLD) 406. This voltage waveform 404 (or voltage waveform 405) provides a reference signal that is well-suited for measuring phase differences between voltage and current.

For an example circuit of this invention, SiC FET power transistors can be used in the full-bridge 401. To drive the SiC FETs, gate drivers such as UCC21521 4-A, 6-A, 5.7-kVRMS Isolated Dual-Channel Gate Drivers can be employed. The gate drivers are available through Texas Instruments.

Current and voltage waveforms 461, 462 associated with the RF output circuit can be used for phase measurement and loop control. In addition, other circuit nodes and branches can be used for phase measurement and loop control, and not only at the nodes and branches described in this application. Generally, the phases of the I(t) 461 and V(t) 462 output of the power transistors are the phases for which alignment is optimized, so when an engineer selects circuit branches and nodes for phase measurements, branches and nodes are selected with waveforms which substantially represent the phases of I(t) 461 and V(t) 462.

Overview of Closed-Loop Control:

An overview of the closed loop control is shown in the block diagram of FIG. 4A. Note that the invention described in this disclosure can be used in an open loop mode, to electromechanically tune an ultrasonic system without closed-loop feedback control.

The tuning inductor for the present invention has a movable ferrite core, permitting a wide range of adjustable inductances based on the position of the ferrite core. Phase sensitive detection of signals that represent RF current and voltage waveforms is used here to determine an updated target position based on the present position of the ferrite core. The ferrite core is then moved automatically, with a stepper motor mechanism, to the new position, and the process repeats until the desired phase difference between current and voltage is below a pre-set threshold. This section of this disclosure describes the overall control loop and motion of the stepper motor and ferrite core. Phase sensitive detection is described in more detail later in this disclosure.

Example of Closed-Loop Control

A closed-loop example for achieving phase alignment is presented as a block diagram in flow chart form in FIG. 4A. The analog DC signal 415 that is output from the phase detector 406 is input to a first microcontroller 414. The microcontroller 414 digitizes this analog DC signal 415 (internal 12-bit ADC 445 as one example) and averages a pre-set number of measurements of analog signal 415 (in this example 36 measurements are averaged). This average number is then subtracted from the microcontroller's 414 stored "phase goal" value. This difference is a comparison between the measured phase and the stored phase goal and thus quantifies the phase error as a signed number. Thus, an average of 36 phase measurements is calculated before the software in the first microcontroller 414 compares the measured phase to the stored phase goal to determine the number of steps and direction for the stepper motor.

As discussed earlier, the generator operates at one of several elected RF frequencies, and for this example a total of seven RF frequencies are available. In ultrasonic cleaning applications, the frequency is often swept over a given bandwidth of several kHz. The averaging of the measured phase errors—e.g., 36 measurements are averaged in this example for each phase correction cycle—helps correct the effects that the RF sweep can have on the phase information.

Referring collectively to FIG. 4A and FIG. 4B, a stable V(t) reference 404 is obtained from a gate timing signal 404 internal to the CPLD 406 and is one input to the phase detector system 900. A second signal 411 that represents a 90-degree-phase-shifted I(t) 461 (as a phase-shifted digital signal) is a second input to the phase detector system 900. Note that the I(t) waveform 461 is sensed and conditioned in the sensor 915 section of the block diagram (FIG. 4A) before its signal reaches the phase detector system 900. For example, the I(t) 461 at the input to the output transformer 429 is sensed using a current transformer 407 with a high ratio of secondary-to-primary turns. The signal that is output from the current transformer 407 is conditioned by a low pass filter 409 and zero-crossing detector 410 before the resulting 90-degree-phase-shifted digital signal 411 enters the phase detector system 900.

The phase detector system 900 in this example is contained within the CPLD 406 and comprises an XOR gate 601 followed by a low pass filter 412 and a buffer 413. The output of the phase detector system 900 (output of buffer 413) is an analog DC voltage 415 that is connected to the input of the first microcontroller 414. The DC voltage 415 is proportional to the phase difference of the signals entering the XOR gate 601. The low-pass filter 412 imparts an approximate 90-degree phase shift so that the DC output of the phase detector system 900 has a midpoint that corresponds to Vdd/2 (in this example, the CPLD and ADC has a Vdd of 3.3V, nominally). This midpoint corresponds to approximate phase alignment between the output current I(t) 461 and output voltage V(t) 462.

Continuing to refer to the flowchart presented in FIG. 4A, between the controller 414 and system 905 is a system input 910. The system input 910 comprises a two-way serial connection between the first microcontroller 414 and the second microcontroller 416 that can send updated position information 450 to the second microcontroller 416 and for sending updated position information 450A from the second microcontroller to the first microcontroller. For the example presented here, the position information 450 is scaled downward so that there are 30 ADC units per stepper step, to provide stepper compatible units. This two-way serial connection is labeled 456 in FIG. 4B.

The system 905 (sometimes called "controller system" 905) comprises a $2^{nd}$ microcontroller 416, stepper driver IC 418, stepper motor 419, inductor 421 capable of interfacing with a moveable core, mechanical link 420 from the stepper motor 419 to the movable ferrite core 422, a full H-bridge 401, and gate drivers 402, 403 for the power electronics 401 (also called H-bridge 401). The I(t) 461 and V(t) 462 are output signals generated from the power transistors which are included in the controller system 905 block of FIG. 4A and directed toward the output transformer 429, the load 480, and the sensor system 915.

The sensor system 915 comprises a current transformer 407, resistor 408, 90-degree phase shifter 409, and a zero-crossing detector 410. The current transformer 407 senses the I(t) 461 output current, producing a voltage waveform 423 that represents the phase of the current 461. In other words, the components of the sensor system 915 condition the output of the current transformer 407 for use as a clean and suitable digital signal waveform 411 that represents the phase of I(t) 461, combined with a nominal 90-degree offset. This digital signal 411 is an input to the phase detector system 900. Further Details of the Control Loop System:

Referring to FIG. 4A and FIG. 4B collectively, the analog DC signal 415 is proportional to the phase difference between the two inputs 404, 411 to the XOR gate 601. The DC signal 415 is input to the first microcontroller 414, which is located on the generator's main control board 452. Signal 415 is converted to a digital signal by an analog-to-digital converter (ADC) 445, as illustrated at FIG. 7, to a digital signal 930.

The digital signal 930 out of ADC 445 can be on any numerical scale. For this example, the scale is 0-to-4095 and is based on a 12-bit number (a "count") between 0 and 4095. (The microcontroller in this example has a 12-bit ADC.) Any range of numbers for the ADC output count can be used depending on the number of bits available, and any numerical output from the ADC can be scaled upwards or downwards for convenience. For example, the total possible range of phase differential, in this case 0-to-4095 (or 2048), can be subsequently divided by 11.375 to give a number that corresponds to angular degrees.

Figure 7:
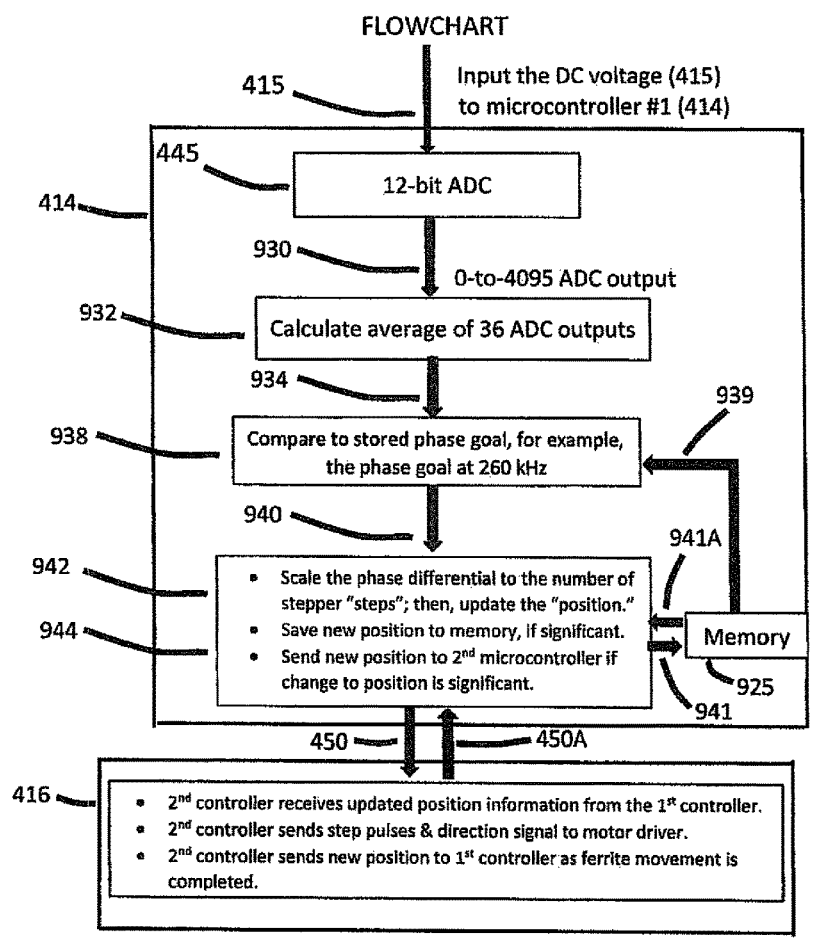
FIG. 7 is a flowchart of a first microcontroller and its software.

Referring to FIG. 7, the first microcontroller 414 calculates 932 an average 934 of one or more acquired digital signals 445 so an average value 934 of the ADC output 445 can be compared 938 to a phase goal 939. The phase goal 939 is a stored value specific for a selected operating frequency $f_0$ 936 of the system, and the firmware variable in this example is named "phase_goal". For an example, an average 934 of 36 phase measurements of the digital signal 930 is calculated 932 by the firmware in the first microcontroller 414. This comparison 938 results in a value 940 (also called "phase value 940") that is the measured phase differential 934 subtracted from the phase goal 939, in ADC units. Therefore, there are two phase differentials in this example—(i.) the differential 934 between current and voltage as determined by an average of 36 measurements out of the phase detector, and (ii.) the differential 940 between the phase detector's differential 934 and the stored phase_goal value 939. Note that a technician or equivalent thereof selects the operating frequency $f_0$ 936 of the system. Sets of initialization parameters—or default parameters—including the phase goal 939 for each frequency $f_0$ 936, are stored in memory 925 for retrieval.

The first microcontroller 414 scales the phase differential value 940 (a number between 0-4095 in this case) by a factor of 30 to convert to "stepper units" ("steps"). For this example, the firmware variable that corresponds to the scaled phase differential value 940 is called "phase_step" 942. The firmware adds the value of phase_step 942 to the existing stored default value of the stepper position 941A (as the existing, stored firmware variable "default_stepper" 941A) and updates it to default_stepper 450. In other words, default_stepper 450 is the newly updated value of default_stepper 941A. This update happens—for this example—only if the phase differential value 940 exceeds a threshold of 50 ADC units, to reduce (or avoid) back-and-forth mechanical jitter in the stepper mechanism.

Referring collectively to FIG. 4A, FIG. 4B, and FIG. 7, the variable "default_stepper" refers to the x-position of the ferrite core in units of stepper steps. It is updated throughout the initialization and loop cycles. It is updated at the end of each positioning cycle (and can be updated during its positioning cycle) for convergence and maintenance of the desired phase alignment of V(t) 462 and I(t) 461. The $1^{st}$ microcontroller reads and writes the updated x-position 941 to memory 925. The latest value of x-position 941 is stored for subsequent feedback cycles and the most recent optimum value of x-position is stored in EPROM for use during another power-up of the generator, or when the operator re-selects the f0 after switching to another output frequency, or if convergence condition is temporarily lost.

To calculate the number of stepper steps to move, the $2^{nd}$ microcontroller receives the updated default_stepper value 450 and compares is to the value of default_stepper 450A that is previously stored in the $2^{nd}$ microcontroller. The difference—as determined by the second microcontroller—defines the pulse train applied to the stepper driver. Once the number of steps is completed by the stepper, the $2^{nd}$ microcontroller acknowledges the position 450A by sending back an acknowledgement to the $1^{st}$ microcontroller. During this cycle, the first microcontroller writes the updated position 941 to memory 925.

The variable that keeps track of present and updated x-positions, in stepper units, is called "default_stepper." This variable is updated during initialization and feedback cycles, as described herein. The table below lists reference characters that describe x-position and n the variable "default_stepper":

TABLE X

X-Position terminology as used in examples

| Reference character | Name | Firmware variable name and details |
|---|---|---|
| 450 | X-position, in units of stepper steps, as sent from $1^{st}$ microcontroller to the $2^{nd}$ microcontroller | "default_stepper" 450 is a variable in the first microcontroller, and is periodically updated in $1^{st}$ microcontroller, for sending to $2^{nd}$ microcontroller |
| 450A | X-position, as stored in the $2^{nd}$ microcontroller, and used by $2^{nd}$ microcontroller to calculate the number of steps upon receiving the updated X-position 450 from the $1^{st}$ microcontroller, and for subsequently updating the x-position 450A by sending an acknowledgement of this value to the $1^{st}$ microcontroller when steps are completed. | "default_stepper" 450A is a variable in $2^{nd}$ microcontroller, as updated as its new value of default_stepper, as received from $1^{st}$ microcontroller. This variable is also used by the $2^{nd}$ microcontroller for calculating the number of steps to send to the stepper driver. |
| 941 | X-position, during write to memory925 in $1^{st}$ microcontroller. | "default_stepper" 941 |
| 941A | X-position, during read from memory 925 in $1^{st}$ microcontroller. | "default_stepper" 941A |

The updated position value 450 (default_stepper 450) is sent to the second microcontroller 416 and the second microcontroller compares the updated value 450 to its existing (stored) default_stepper value 450A and calculates the difference between these values. This subtraction directly gives the following: (i) the number of steps—to be implemented as a sequence of stepper pulses to be sent to the driver's "STEP" input —; and (ii) the binary value of the driver's "DIR" input—to give direction of the movement. The $2^{nd}$ microcontroller sends this information to the stepper driver IC 418 for driving the stepper motor 419 to move the ferrite core 422. Note that ferrite core 422 moves 0.2 mm per stepper step over a full range of travel of 254 mm (10 inches) in this application's example. However, once the ferrite 422 is positioned in its initialized location—depending on the generator's nominal frequency that is selected —, the maximum amount of ferrite travel for that $f_0$ is approximately ±15 mm, in practice.

Once the set of steps is completed by the stepper mechanism, the $2^{nd}$ microcontroller stores this present position 450A in its memory as the present default_stepper value and sends this present position 450A back to the first microcontroller for acknowledgment. In practice, the value of default_stepper 450A returned to the first microcontroller 404 is usually the same as the value of default_stepper 450 originally transmitted to the second microcontroller. The first microcontroller writes this value of default_stepper 941 to memory 925 as the acknowledged location of the ferrite core, and there are no further changes to the default_stepper value until a subsequent feedback cycle that exceeds the phase difference threshold. As an alternative implementation, the sending of the ferrite position information from the second microcontroller to the first microcontroller can take place more frequently, while the stepper is moving the ferrite core.

Calibration of Ferrite Position:

Promptly after power-up of the generator, the second microcontroller 416 has firmware to move the ferrite core 422 to the end-of-travel and senses a "make/break" signal from a limit switch. Thus, the position is set to zero. Before any feedback cycles, the ferrite core moves to a position of "25"—in this example—to avoid resting against a dead stop.

This is followed by a sequence of stepper steps to move the ferrite core 422 away from the stopped limit to the most recently saved value of position—as the most recently stored variable "default_stepper".

For tuning the output, for this example, there are four coaxially arranged air-core tuning inductors and only one of which is used for the positioning of the ferrite core at a given frequency $f_0$. There may be other—non-variable, fixed value—tuning inductors available for switching into the circuit—for a given $f_0$—but are not reachable by the ferrite. For example, for a given frequency one or more inductors can be connected in series electrically—using relays —, but only one of these connected inductors is used to for the initial positioning and closed loop tuning of the ferrite core 422. To move to its initial position, the ferrite core 422 is free to travel along the entire—substantially hollow—axial length of these four serially arranged inductors. In other words, depending on the frequency selected, and after zeroing with the limit switch, the ferrite is subsequently instructed to travel to within the minimum or maximum travel limit for the specific variable inductor that is used for tuning a given frequency $f_0$. To initialize the ferrites position, there is firmware code that adds a fixed offset length—within the limits of "max_stepper" or "min_stepper" for the elected $f_0$—, so that the ferrite's initial X-position, immediately before any feedback cycles, has this fixed offset added to its position variable default_stepper. Therefore, the ferrite core 422 travels to this nominal "$f_0$" X-position before attempting any further convergence attempts based on phase measurements and loop control. Therefore, the default_stepper value, immediately before loop control, represents the X-position of the ferrite core.

In sum, the position information in this example is saved in the firmware variable "default_stepper." The default_stepper variable is in units of "stepper steps" as counted from the limit switch (from zero), at 0.2 mm per step, and the total number of steps is based on (i.) a zeroing calibration at the hard stop of the limit switch, plus (ii.) the X-offset to move the ferrite to its starting position within in the sequence of four in-line inductors, plus (iii.) any further stepper steps based on measured and subsequent phase differences during loop control. "Default_stepper" is therefore the variable name for the x-position relative to the limit switch (zero), and its value is further updated on subsequent feedback cycles if the phase difference is above a pre-set threshold. The firmware saves the most recent position—"default_stepper" as the x-location as number of steps—for future optimizations. This is done by a default_stepper 450A acknowledgment sent from the second microcontroller to the first microcontroller, followed by writing the updated value of default_stepper 941 to memory 925. For example, saving the most recent position 941 as "default_stepper" is useful upon generator power-down and generator restart, so that further attempts at automated tuning—at that frequency—is quicker and with less overall phase error over the convergence timescale.

Note that for the case of a 0-to-4095 ADC range 930, a midpoint ADC output value of 2048 generally indicates good alignment between the phases, with a 50% duty cycle at the output 415 of the phase detector—to be described in more detail, later herein. Moreover, the invention's method has been further refined so that each nominal frequency—35 kHz, 73 kHz, 121 kHz, 135 kHz, 158 kHz, 217 kHz, and 260 kHz—has its own default optimum phase goal 939 stored in memory 925 before any feedback control is done. Again, the optimum setting of the phase_goal for the desired convergence may or may not be a value that corresponds to zero degrees phase alignment, and this is at the discretion of the technician or engineer setting up the generator. In other words, there can be circumstances where ultrasound system performance is better at a given frequency $f_0$ with phase goal values that do not correspond to zero-degrees phase differential.

The direction of movement of the ferrite core is positive "+" or negative "−" by referring to the sign of the of the difference between the phase goal 939 and the measured phase 930. Thus, the difference between the phase goal 939 and the measured phase 934 determines the amount of movement and direction of movement of the ferrite core 422. The first microcontroller 414 then sends the scaled value 450 of the ADC count signal 934—scaled to stepper units—to a memory unit 925 to store the scaled value 450—as "default_stepper" 450. Regarding to FIG. 7, memory unit 925 for this example is contained within the first microcontroller 414 and second microcontroller 416; in addition, the memory unit 925 can located elsewhere, and can be external to the microcontroller. This results in an updated, stored default_stepper value that represents an updated target position for the ferrite core 422.

The second microcontroller 416 communicates—on a frequent periodic basis—the instant ferrite 422 position 450A to the first microcontroller 414, and if the updated default_stepper value is different from the previous value of default_stepper 450 sent to the second microcontroller, then this default_stepper value 450 is communicated serially back to the $2^{nd}$ microcontroller, further movement is calculated, and step pulses are sent to the stepper driver 418 together with direction "DIR" input for moving the ferrite 422 to the calculated position. Thus, the second microcontroller 416 to uses the position information 450 received from the first microcontroller 414 to determine the movement information it sends to the stepper driver 418, stores the updated position 450A. and then sends an acknowledgment to the first microcontroller 414 when the ferrite core settles at the new position 450A.

Typically, but not always, convergence occurs in less than five loop cycles—also called feedback cycles. The ferrite movement per cycle is proportional to the measured phase error 940—also called "phase value" 940 —, so there is generally less movement per cycle, proportionately, as convergence nears. This process is primarily "digital proportional control." In this example, there is a small amount of "derivative" component to the correction, too. For example, during the scaling of the ADC output—by a factor of 30—, a single stepper step is then added for positive errors, and for the case of negative errors, a single step is subtracted. The convergence correction scheme can be altered as needed, by adjusting the proportion, or by adding some derivative components, or by including some integral components. This disclosure is not limited to responsive corrections that are purely proportional or mostly proportional, because other types of control loop mechanisms are possible. However, the example given is mostly proportional.

Overview of Position Communication and Stepper Movement:

Set forth are further details to the control loop mechanism.

First, the variable inductor is comprised of an axially aligned set, for example, of four separate air core inductors. The ferrite core 422 can travel along the axis of this co-axial arrangement of inductors, for example, for a total length of 254 mm. The ferrite is instructed by the system to move to the tuning inductor 421 that is used for the selected output frequency $f_0$. This movement is based on the stored x-position value of default_stepper 941A. This value of default_stepper is further communicated to the second microcontroller as the updated default_stepper value 450. The variable inductor used for tuning might be comprised of one single inductor 421, or it might be comprised of one inductor 421 that is switched into the circuit out of the several available tuning inductors that are aligned coaxially, combined with additional tuning inductance in which the ferrite cannot reach. These tuning inductors 421 are individually switched and sometimes combined—via relays—into the generator's output to achieve a suitable nominal inductance for setting the overall generator frequency—for example, 35 kHz, 73 kHz, 121 kHz, 135 kHz, 158 kHz, 217 kHz, and 260 kHz. In other words, the relay connections depend on the desired output frequency $f_0$ of the generator. So, once the relays are switched, the ferrite is automatically positioned into the appropriate inductor 421, the generator is ready to operate at that given preselected frequency and, furthermore, the generator is ready to adjust its output phase differential between I(t) 461 and V(t) 462.

Second, the ferrite core 422 in this example can travel the entire distance of the full set of colinear air core inductors. The X-position has a range that is for this case 0-to-1270 stepper steps. At 0.2 mm per step, this corresponds to 254 mm total travel—10 inches. Note, once the ferrite core is positioned into its nominal—starting—position for a given output frequency, then it can travel approximately ±2048 ADC units—±68 stepper units, corresponding to about ±0.5 inches.

Third, once the generator is powered-on, an automatic initialization process begins, and the ferrite core 422 moves continuously along the X-position of the co-linear inductors until it hits a 'full stop' and triggers a 'limit switch.' This event is sensed and thus defined by the hardware and software as the "zero" position (step count=0). The limit switch communicates this full stop back to the $2^{nd}$ microcontroller 416. Then, via a two-way serial connection, this position information 450A is communicated back to the first microcontroller 414 on the main controller board (see, FIG. 4B). There is a two-way serial connection 456 between the first microcontroller and second microcontroller. This two-way serial connection 456 is also depicted in FIG. 4A as system input 910.

Fourth, as part of the initialization process, the ferrite plug 422—soon after the initial zeroing—moves away from the full stop to a value of "25", to avoid maintaining a full mechanical hard stop against the limit switch, avoiding local overheating.

Fifth, for the ferrite core to travel to its beginning position at a given frequency setting—35 kHz, 73 kHz, 121 kHz, 135 kHz, 158 kHz, 217 kHz, and 260 kHz, for example—the first microcontroller 414 starts off initialized for optimum "X-position" for a given frequency output $f_0$ by reading the default_stepper value 941A from memory 925. The $1^{st}$ microcontroller 414 sends 456 position information 450 to the $2^{nd}$ microcontroller 416 which compares this value of X-position 450 to the value of the position 450A—that the $2^{nd}$ microcontroller currently has stored—to calculate the number of steps to move the ferrite core 422 to a default X-position. In sum, this initial movement to an optimum—default—"starting point" is done as part of the firmware's start-up instructions before any phase differentials are determined.

Sixth, next—or concurrently —, the current (I), voltage (V) phase differential is determined by the phase detector 900—as a DC voltage—and this voltage is converted by the first microcontroller 414 to a count between 0 and 4095.

Seventh, this count is averaged—using 32 ADC readings—by the first microcontroller 414, and the microcontroller's firmware compares the phase differential between the present phase and the phase goal. This is the "phase difference," which is also called "phase value." It is in ADC units. If the phase difference—phase value—is greater than a threshold—at least 50 ADC units in one example —, then the firmware converts the phase value to stepper units by dividing by 30, and the new variable is called "phase_step". This is the "error" or "correction" for this cycle, in units of steps. In the first microcontroller, the value of "phase_step" is added to the existing X-position information 941A—this variable is called default_stepper, as read from memory 925—to provide an updated—desired—position 450. The information is passed to the second microcontroller 416— via a two-way serial connection 456, 910. Then these steps are sent sequentially as pulses from the $2^{nd}$ microcontroller 416 to the stepper driver 418 to move the stepper motor 419 the instructed number of steps and direction.

Eighth, in time, and possibly during this travel period while the ferrite core 422 is moving, and possibly while the ferrite plug 422 is at a 'stop' because it has already reached the instructed number of steps, the first microcontroller 414 computes a new value for phase differential at this new position, and this scaled to "stepper units" and the updated value 450 is communicated to the second microcontroller 416, serially 456. Then, the number of pulses—and direction of movement—is sent to the stepper driver 418 by the second microcontroller 416 and the stepper motor again moves step-by-step, by the instructed number of steps, to the updated position 450A, and thus moves the ferrite core. In other words, this travel movement is implemented by the driver on a pulse-by-pulse basis for the instructed number of stepper steps in the present feedback cycle.

Ninth, during this travel—or shortly thereafter—another phase differential measurement is made and digitized, and a new position is calculated for the stepper, as an updated count.

Tenth, as the phase differential decreases—and the system converges on a suitable phase differential —, the first microcontroller 414 gives step instructions to the second microcontroller 416 that generally—but not always—have a smaller number of steps—as part of the convergence. Thus, in this manner, the movement of the ferrite core 422 slows down overall, per feedback cycle, as the phase differential converges to the desired endpoint.

Eleventh, this phase differential loop continues until the system is within, for example, 100 or less ADC units, preferably 50 or less ADC units of the optimum phase-aligned position, and then it stops, to avoid unnecessary back-and-forth movement —jitter—of the ferrite core 422 at the endpoint.

Twelfth, the closer the ferrite plug 422 position is to the desired phase-aligned endpoint, fewer steps are taken per feedback cycle—generally, but not always —, and the movement begins to slow-down until the endpoint is reached.

In other words, the first microcontroller 414 located on the generator's main control board 451 looks at the measured value of phase differential 934—"phase value" 934—and compares it to the desired set point—phase goal—to obtain the latest phase error. The initial desired set-points—phase goals—are default values—for each of a generator's nominal frequencies, for example, 35 kHz, 73 kHz, 121 kHz, 135 kHz, 158 kHz, 217 kHz and 260 kHz—and normally set by a programmer or technician as an initialization, as pre-configured initialized values. The first microcontroller 414 is has firmware, stored in a memory unit 925, that is normally pre-programmed. This memory and firmware control and set the many of the parameters associated with the functioning of the generator. This software (firmware) with different initial value—for one or more variables—is present at start-up, i.e., when the generator is powered-on, and thus comprises a look-up table. A technician can have access to this firmware and set or alter different initialization values for the convergence goals of the phase differentials—for each of a generator's nominal frequencies, for example, 35 kHz, 73 kHz, 121 kHz, 135 kHz, 158 kHz, 217 kHz, and 260 kHz. The movable ferrite plug 422 that is under feedback control essentially tunes the phase alignment depending on which nominal frequency $f_0$ is selected by the user. The "coarse tuning for nominal frequency" is done by relays, which switch different air-core inductors in and out of the load, in a relatively coarse manner. These air-core inductors are aligned co-linearly, so the ferrite plug 422 can move to any of the inductors in the 254 mm of total travel. However, the system is designed to automatically travel at once to a pre-determined sweet-spot location for a given inductor, depending on the nominal frequency—for each of a generator's nominal frequencies, for example, 35 kHz, 73 kHz, 121 kHz, 135 kHz, 158 kHz, 217 kHz and 260 kHz. In so doing, the convergence is much quicker, more efficient, and avoids placing the output circuitry of the generator severely out of phase for longer-than-desired durations, i.e., avoiding spending a lot of time in unsuitably large phase differentials. By the way, the converged-upon X-position "sweet spot" for each frequency is remembered (stored) by the software and memory unit. The generator looks-up this updated value as the new "initial value" or "default position" for future tuning needs, i.e., the updated default position is based on where it converged during its most recent visit to that inductor and $f_o$, for a given nominal frequency, for a given generator.

The information 450 that is passed to second microcontroller 416 is in stepper-compatible units, as "steps" for example, as scaled from the full range of possible numerical values out of the ADC 445. This information for governing motion is passed from the first microcontroller 414 on the main control board 414 to the second microcontroller 416 on the stepper control board 417. From this, control pulses 430 are sent from the generator's second microcontroller 416 to the stepper driver chip 418 in order to move the stepper motor 419 the correct number of steps and the correct direction, so that the ferrite core reaches its required position. Meanwhile, the phase information is being updated and the first microcontroller 414 located on the generator's main control board adjusts its instructions accordingly, to efficiently converge on the programmed phase alignment goal.

For a 12-bit ADC, and prior to any scaling of the ADC value, a midpoint value of 2048 generally indicates good alignment between the phases, with a 50% duty cycle at the output of the phase detector. Note that the relative current and voltage phases 411, 404 for this optimum alignment are on the order of 90 degrees apart—and not zero degrees. This is because the current waveform 461 was sensed by the current transformer 407 and the resulting output signal is shifted by 90 degrees using a low pass filter 409 before entering the CPLD 406. The reason for the 90-degree phase shift is make phase detector produce a DC output 415 that has a voltage midpoint at approximately Vdd/2, which corresponds to a 50% duty cycle coming out of the XOR gate 601, corresponding approximately to the aligned phases of $I_{OUTPUT}(t)$ 461 and $V_{OUTPUT}(t)$ 462.

Further Details

For the generator 12, there are three relevant PC boards. The PC boards comprise a 2-kW full-bridge main board 451, a generator main control board 452 having a first microcontroller 414, and a stepper drive board 417—also called "motor control board"—having a second microcontroller 416. The first microcontroller, for example and not limited to, can be a PIC18F67J94-I/PT, sold by Microchip Technology, Inc; while the second microcontroller can be, for example and not limited to, a PIC18F26K80-I/SO, also sold by Microchip Technology, Inc. Clearly, those three boards can be on a single board, two boards, the disclosed three boards, or even more boards. The second microcontroller 416 is used for serial communication and keeps track of the position of a stepper 419.

Moreover, there are two microcontrollers in these examples, a first microcontroller 414 located on the generator's main control board 452 and a second microcontroller 416 located on the stepper control board 417. The microcontroller 416 on the stepper control board is used for serial communication and sends pulses to the stepper driver IC 418 for stepper movement and movement direction, and also keeps track of the position of the stepper. There is no requirement that exactly two microcontrollers are required to achieve the invention described herein; since the microcontrollers can be a single unit, the defined two units, or a plurality of units that obtain the same objectives.

Waveforms are compared for phase difference in real time using a phase sensitive detector (PSD). The output of the detector is proportional to the magnitude and sign of the phase differences. After filtering and buffering to obtain a DC level, the DC output is sent to the first microcontroller 414. After some processing (comprising digitizing with an ADC, averaging, and scaling of the digitized number), this new position is communicated serially to the second microcontroller 416, which sends pulses (and direction information) to the stepper motor driver chip 418 for controlling the movement of a stepper motor 419.

The stepper motor 419 has mechanical connections 420 that move a ferrite rod 422 within an air core output inductor 421, thus changing the inductance of the tuning inductance $L_{TUNE}$ 303. This process continues in real time (with updated feedback-determined position instructions that occur, in this example, every one second or so). In this example, the updating of the position and direction information has a "cycle time" of about one second, the calculation of phase differential and updating of position instructions is not a continuous process, it is a discrete process (a type of digital proportional control) that happens in real time until the phase difference between the voltage and current has little effect or no effect on the RF power efficiency between the generator and the load. However, this invention is not limited to digital control or digital proportional control: a similar control system could be implemented for this auto-tuning application using analog control, or another type of digital control method.

Phase Detection and Stepper Movement

The invention described in this disclosure calculates updates for the position of the ferrite core, as needed, based on phase differential between the voltage timing signal 404 and the phase of the output current waveform 461 of the full bridge 401. The phase detection is implemented using an XOR circuit but is not limited to XOR-style phase detection. The updated phase differential information is then converted by software into an instruction regarding the number of steps and direction of movement for the stepper motor.

Figure 6A:
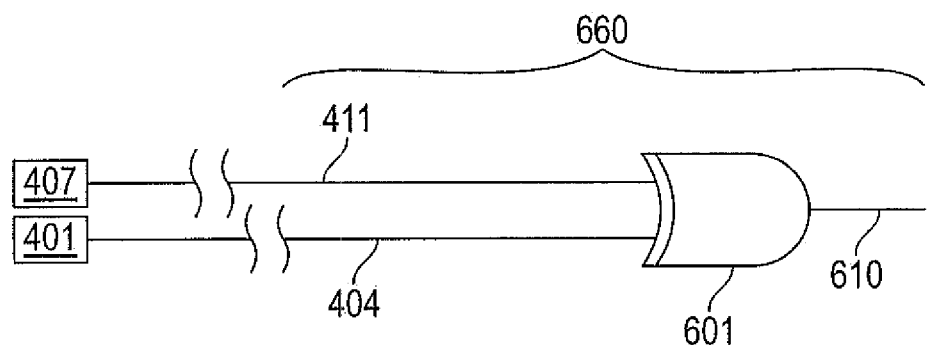
FIG. 6A shows the XOR circuit, as implemented in the main control board's CPLD.
Figure 6B:
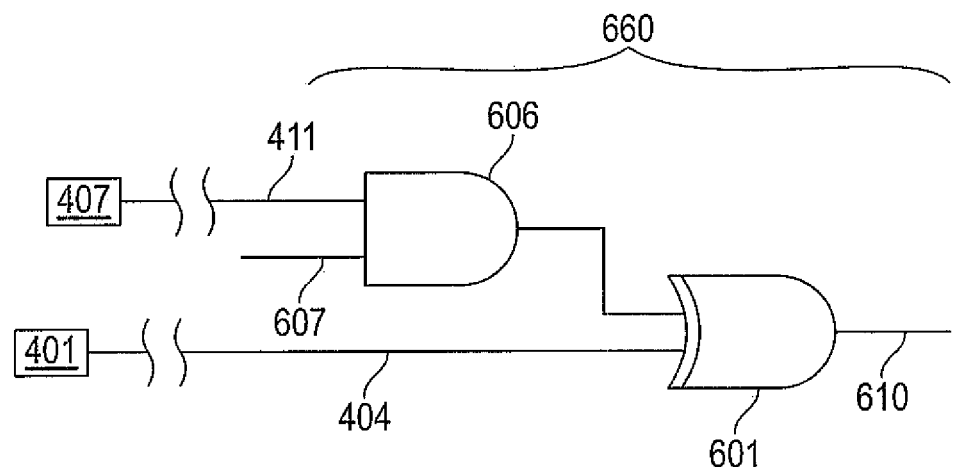
FIG. 6B shows an alternative version of FIG. 6A of the XOR circuit with an AND circuit, as implemented in the main control board's CPLD.

Voltage Reference for XOR Circuit:

Gates drive integrated circuits 402, 403 are used to drive IGBTs, power field effect transistors, or other devices for power electronics. Referring to FIG. 4B, in this example, voltage pulse trains 404, 405, at frequencies near the resonant frequency of the load 480, where said pulse trains originate in a complex programmable logic device (CPLD) 406, provides timing signals that are used for driving the inputs to the gate drivers 402, 403 as illustrated at FIG. 4B. These voltage waveforms 404, 405 are stable voltage timing signals that originate in the CPLD 406. Furthermore, 404 and 405 are routed out of the CPLD and enter their respective gate driver ICs 402 403, But, independently, either one of these timing signals 404, 405 can be used as a voltage timing—reference—signal for the phase detection for achieving suitable V, I alignment. The signals 404, 405 are dual-purpose, routed out of the CPLD for driving gates for the power transistors, and this example are used internally for the XOR gate 601 input as illustrated at FIGS. 6A and 6B. In addition, voltage pulse trains 404, 405 provide a reference signals that are well-suited for measuring phase differences between itself and output current 461. In practice, only one of these two pulse trains 404, 405 is used as the reference input to the XOR phase gate 601.

Waveform Representing Current for Input to the XOR Circuit:

Now, referring to the block diagram in FIG. 4B, current 461 is the current output of the power transistors of the full bridge 401. This current 461 is sensed by a current transformer 407 having a resistor 408 across its secondary to set the voltage range of the current-sense output signal 423. Thus, the current-sense signal 423 is a voltage waveform that has its phase set according to the current waveform 461. In other words, the waveform 423 carries the phase information of the current waveform 461. The waveform 423 is then routed through its own 90-degree phase shifter 409 and zero-crossing detector 410 as described below before entering the phase sensitive detector 660 that is inside the CPLD 406.

A phase sensitive detector (PSD) circuit 660 (see, FIGS. 6A and 6B) is implemented within a complex programmable logic device 406 (CPLD) (see, FIG. 4B) that is located on the generator's main controller board 452. As shown at FIG. 6A, the PSD circuit 660 has two inputs to its XOR gate 601, a voltage waveform that represents current as a function of time 411—along with a nominal 90-degree phase shift—and a waveform that serves as a timing reference, as voltage as a function of time 404.

To serve as an example, visualize the frequency of the gate voltage signal $f_o$ as being set near the resonant frequency of the transducer array, perhaps near at a frequency near 40 kHz. It is also helpful to visualize that the output of 40 kHz—with a period of 25 microseconds—is often gated OFF for a fraction of a line-frequency period, so that the generator's output is periodically in an OFF state every $\frac{1}{120}^{th}$ of a sec (every 8.33 ms), with an OFF duration of about 1.0 ms. Therefore, there are many oscillations of the 40 kHz output frequency between times during which the output is gated ON and OFF. Alternatively, gating can be turned off completely, or other values of period & duration can be used, for example, ranging from 50 microseconds to 100 milliseconds.

Figure 5:
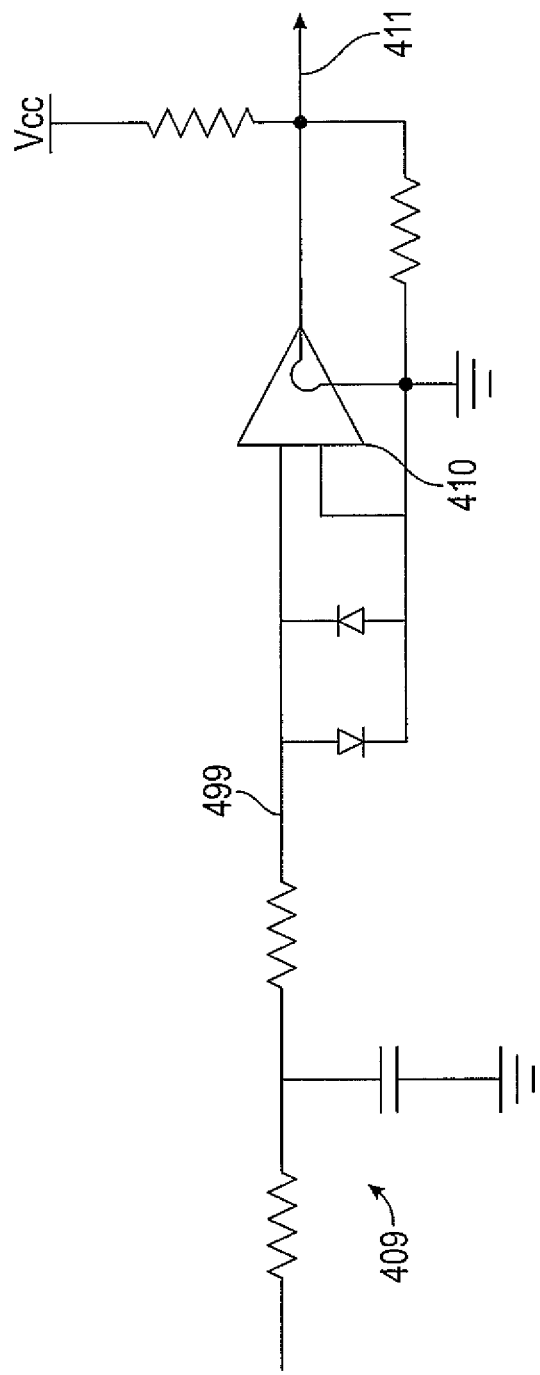
FIG. 5 shows a schematic of how the current waveform is conditioned with a low-pass filter to provide a 90-degree phase-shifted current waveform before entering the CPLD; the 90-degree phase shift in the current waveform permits the XOR gate to output a range of phase-error information that is symmetrically centered around an optimum middle (or near middle) value.

In contrast to the voltage waveform 404, the current waveform 423 is not usually a clean signal. Referring to FIGS. 4A and 4B, the current is sensed with a feedback current transformer 407 (feedback CT) whose output current is driven across a fixed resistance 408, resulting in a waveform 423 that represents the current. This "current" waveform 423 is conditioned with a resistor-capacitor (RC) low-pass filter 409 (FIG. 4), with sufficiently large time constant to impart a 90-degree phase shift. This is sometimes referred to as the 90-degree phase shifter. The filtered current signal 499 (see, FIG. 5) then goes to a comparator 410 (FIG. 4B and FIG. 5), for squaring-up (of its shape) and is thus further routed to downstream logic gates as a digital signal 411 that carries the phase information of the original current waveform 461, but with a 90-degree phase shift. The comparator 410 is also called a "zero-crossing detector." So, signal 411 is a digital voltage signal that carries the phase information related to current I(t) 461. Signal 411 is also called the "current input" to the XOR gate 601 fo the phase detector 660, and the other input to XOR 601 is the voltage input 404.

Alternatively, referring to FIG. 6B, prior to the input to the XOR gate 601, the waveform that represents current 411 is routed through a 2-input AND gate 606. The second input 607 to the AND gate 606 is at logical low during the OFF time of the generator, so that when the generator's output is gated off (as described earlier in this disclosure), the output of the AND gate 606 is at a steady low. Under this condition, the output of the XOR 601 is simply the 50% duty cycle of the voltage reference signal 404 that is connected to the XOR 601 input. Therefore, for phase measurements that coincide with the OFF time, the output voltage 610 duty cycle is simply 50%.

The pulsed output 610 of the PSD circuit 660 is converted to analog DC. The XOR gate 601 thus compares the current's phase 411 to the gate's voltage phase 404, resulting in an output signal 610 that, for this XOR style of phase detector circuit, is generally twice the frequency (2 times $f_o$) of the gate voltage signal 404. The output signal 610 has a duty cycle that is proportional to phase error. The output signal 610, as illustrated at FIG. 4B, then sent through a low pass filter 412 (external to the CPLD), followed by a buffer 413, to establish a DC voltage 415 that is proportional to the phase difference between (a) the waveform that represents current 411 and (b) the voltage reference waveform 404. The combination of the phase detector 660, low pass filter 412, and buffer 413, is also called the "phase detector" 900 or "phase detector system" 900.

For a CPLD 406 supplied by 3.3V, with a 50% duty cycle at the XOR voltage input, and with the current input kept low, an XOR output 610 average will be approximately 1.65V. Keeping in mind that this DC voltage gets converted to a digital number, this analog DC voltage of 1.65V is usually the desired endpoint—or "set-point" or "phase goal"—of the control circuit—as expressed in analog voltage units—where the digital output of the ADC has-a midpoint of 2048 ADC units that generally indicates good alignment between the phases, as is further described herein. Often, the control software (not identified) has wide endpoint tolerances that accept results that are not perfect. For example, phase differences within about ±30 degrees will be considered at the end-point, as illustrated at FIGS. 2B and 2C.

Therefore, the pulses at the output 610 of the phase sensitive detector are then sent to a low pass filter 412 followed by a buffer 413—the buffer is to change the impedance of the signal —, to provide an average DC analog output 415 that is proportional to phase error. Here, the midpoint of the error range is Vdd/2 (in this case, 3.3V/2), and wherein when an output signal 415 that is less than 1.65V indicates that current is leading the voltage, and wherein an output signal 415 that is greater than 1.65V indicates that current is lagging the voltage.

A variable inductor, for autotuning, as an example, comprises the stepper driver 418, a stepper motor 419, a mechanical pulley system 420 for interfacing the stepper motor 419 to the moveable ferrite core 422, a substantially hollow air-core tuning inductor 421, and the air-core tuning inductor 421 whose inner diameter is suitable for the moveable ferrite core 422. In one example, the stepper motor 419 is model 17HS13-0404S, NEMA 17 Bipolar 1.8-degree 26 N-cm (36.8 oz-in) 0.4 A 12V 42×42×34 mm 4 Wires. An example of ferrite rod 422—used for moveable cores—is 3C94 Ferroxcube. The air core inductor is typically wound on a hollow cylindrical form (cylindrical shell).

An example stepper driver chip 418 is the Allegro Micro-Systems LLC's A3967SLBTR-T. The A3967SLBTR-T is a complete micro-stepping motor driver with built-in translator. It is designed to operate bipolar stepper motors in full-, half-, quarter-, and eighth-step modes, with output drive capability of 30 V and ±750 mA.

Application Example—Multi-Frequency Ultrasound Systems

Autotuning can be applied to a multi-frequency (relay-selectable) ultrasound generator. Multi-frequency generators include, for example, the multiSONIK® 2 and multi-SONIK® 3. In this example, the midpoint value out of the phase detector 660 depends on the generator's output frequency $f_o$, because a middle value of 2048 (out of a 4096 12-bit range) may or may not be ideal for any given frequency in terms of optimizing phase alignment for an ultrasonic system. Part of the reason for this is the intentional RC low-pass filter 412 imparts a nominal 90-degree phase shift that the is current waveform undergoes just prior to entering the first microcontroller 414. The exact phase shift is frequency dependent, so the midpoint value of 2048 is not necessarily optimum, depending on output frequency. Thus, the software can have endpoints (goals) that are shifted away from the mid-point count. For one example, an $f_0$ of 270 kHz could have a count goal of 2000 when locked (i.e., when loop control stops searching for better count values). For another example, an $f_0$ that is much lower than 270 kHz might have a goal of 1500-to-1600 ADC units when locked. So, the midpoint ADC number is another degree-of-freedom that can be used to optimize alignment and to make the tuning process more efficient. Moreover, the endpoint tolerances are moderately loose, for example an ADC count within ±50 of the goal is close enough and will be locked under those conditions until it falls out of the ±50 range.

At least one ultrasound generator of the invention utilizes silicon carbide (SiC) MOSFETs for the output power transistors. An example is ROHM SCT3120ALGC11, an N-channel 21A 103 W SiC power MOSFET.

At least one ultrasound generator of the invention that utilizes power transistor drivers for each half-bridge as, for example, Texas Instruments chip UCC21521 4-A, 6-A, 5.7-kVRMS Isolated Dual-Channel Gate Driver with Enable.

The present invention concerns the applied uses of ultrasound energy, and the application and control of ultrasonics to clean and process delicate parts, e.g., semiconductor wafers, within a liquid. Generally, in accord with the invention, one or more ultrasonic generators drive one or more ultrasonic transducers, or arrays of transducers, coupled to a liquid to clean and/or process the delicate part. The liquid is preferably held within a tank; and the transducers mount on or within the tank to impart ultrasound into the liquid.

As described and illustrated in this application, this invention is directed to phase adjustment in order to improve efficiency and performance of the system, in an automated way, without so much intervention by a technician. Moreover, the system can adjust itself in the customer's setting as the customer, on-the-fly, selects different tank temperatures, different tank fluid depths, different operating conditions, different cleaning applications, and the system optimizes itself without having to call a technician each time. These automated adjustments are an enormous advantage over the prior devices.

The invention thus attains the objects set forth above, among those apparent from preceding description. Since certain changes may be made in the above apparatus and methods without departing from the scope of the invention, it is intended that all matter contained in the above description or shown in the accompanying drawing be interpreted as illustrative and not in a limiting sense.

It is also to be understood that the following claims are to cover all generic and specific features of the invention described herein, and all statements of the scope of the invention which, as a matter of language, might be said to fall there between.

The invention claimed is:

1. A system for delivering ultrasonic energy to a transducer load, comprising;
   at least one ultrasonic transducer, and
   a radio frequency (RF) generator for delivering RF power to the transducer load, and having
   (a) an output circuit that has at least one tunable resonant frequency,
   (b) a voltage circuitry system that senses an output voltage waveform,
   (c) a current circuitry system that senses an output current waveform,
   (d) a phase detector circuit for measuring a phase differential between the output voltage waveform and the output current waveform, wherein the phase detector circuit receives a voltage signal input and a current signal input,
   (e) a comparator that compares the measured phase differential to a desired phase difference to generate a phase value;
   (f) a motor controller evaluates the phase value and based on the phase value automatically repositions or maintains the position of a moveable metallic core within a variable inductor, to generate a desired ultrasonic transmission in a liquid wherein the output voltage waveform and the output current waveform phases of the output circuit are approximately aligned.

2. The system of claim 1, wherein a low pass filter receives the phase value prior to the motor controller receives the phase value.

3. The system of claim 1, wherein the phase detector circuit measures the output current waveform and the output voltage waveform at an output transformer's secondary windings.

4. The system of claim 1, wherein the phase detector circuit measures the output current waveform at an output transformer's primary windings and the phase detector circuit measures the output voltage waveform directly from timing pulses wherein gate driver circuits are used to drive gates of output transistors.

5. The system of claim 1, wherein the phase detector circuit measures the output voltage waveform directly from gating pulses that drive output transistors.

6. The system of claim 1, wherein the at least one tunable resonant frequency of the output circuit is tuned by the motor controller positioning the metallic core to reduce the phase differential between the output current waveform and the output voltage waveform.

7. The system of claim 1, wherein the at least one tunable resonant frequency of the output circuit is tuned by the motor controller positioning the metallic core to align the phases of the output current waveforms and the output voltage waveforms.

8. The system of claim 1, wherein an electrical resonant frequency of the load is within ±10% of a mechanical resonance frequency of the transducer.

9. The system of claim 1 wherein phase differences between the output current waveform and the output voltage waveforms are within about ±30 degrees.

10. The system of claim 1 wherein phase differences between the output current waveform and the output voltage waveforms and a phase goal are within about ±30 degrees of the phase goal.

11. The system of claim 1 wherein the comparator has a first microcontroller that (a) compares the measured phase differential to a desired phase difference set point to generate a phase value; and (b) has a memory unit that stores the desired phase difference set points, wherein the desired phase difference set points can be pre-programmed or altered by a user of the system.

12. The system of claim 10 wherein desired phase difference set points are established for each of the nominal frequencies of the radio frequency generator.

* * * * *